United States Patent
Tanabe et al.

(10) Patent No.: US 8,242,536 B2
(45) Date of Patent: Aug. 14, 2012

(54) SEMICONDUCTOR DEVICE

(75) Inventors: Hiromitsu Tanabe, Nukata-gun (JP); Kenji Kouno, Gifu (JP); Yukio Tsuzuki, Nukata-gun (JP); Shinji Amano, Okazaki (JP)

(73) Assignee: DENSO CORPORATION, Kariya (JP)

( * ) Notice: Subject to any disclaimer, the term of this patent is extended or adjusted under 35 U.S.C. 154(b) by 398 days.

(21) Appl. No.: 12/656,340

(22) Filed: Jan. 26, 2010

(65) Prior Publication Data

US 2010/0187567 A1 Jul. 29, 2010

(30) Foreign Application Priority Data

Jan. 27, 2009 (JP) ................................ 2009-015714
Jan. 7, 2010 (JP) ................................ 2010-002345

(51) Int. Cl.
*H01L 29/739* (2006.01)
(52) U.S. Cl. ................ 257/140; 257/E29.198
(58) Field of Classification Search .............. 257/140, 257/341, 355, 378, 506, 370, E29.198
See application file for complete search history.

(56) References Cited

U.S. PATENT DOCUMENTS

| | | |
|---|---|---|
| 5,559,355 A | 9/1996 | Yamazaki et al. |
| 2005/0017290 A1 | 1/2005 | Takahashi et al. |
| 2005/0258493 A1 | 11/2005 | Aono et al. |
| 2008/0048295 A1 | 2/2008 | Takahashi |
| 2008/0315248 A1 | 12/2008 | Tokura et al. |
| 2009/0057832 A1 | 3/2009 | Kouno |

FOREIGN PATENT DOCUMENTS

| | | |
|---|---|---|
| JP | A-2003-142689 | 5/2003 |
| JP | B2-3450650 | 7/2003 |
| JP | A-2004-88001 | 3/2004 |
| JP | A-2007-258363 | 10/2007 |
| JP | 2008-072848 | 3/2008 |

OTHER PUBLICATIONS

Office Action mailed Jan. 18, 2011 in corresponding JP patent application No. 2010-2345 (English translation enclosed).

*Primary Examiner* — Benjamin Sandvik
*Assistant Examiner* — Whitney T Moore
(74) *Attorney, Agent, or Firm* — Posz Law Group, PLC

(57) ABSTRACT

A semiconductor device includes a semiconductor substrate having a first surface and a second surface. A main region and a sensing region are formed on the first surface side of the semiconductor substrate. A RC-IGBT is formed in the main region and a sensing element for passing electric currents proportional to electric currents flowing through the RC-IGBT is formed in the sensing region. A collector region and a cathode region of the sensing element are formed on the second surface side of the semiconductor substrate. The collector region is located directly below the sensing region in a thickness direction of the semiconductor substrate. The cathode region is not located directly below the sensing region in the thickness direction.

19 Claims, 10 Drawing Sheets

SEMICONDUCTOR DEVICE

CROSS REFERENCE TO RELATED APPLICATION

This application is based on and incorporates herein by reference Japanese Patent Application No. 2009-15714 filed on Jan. 27, 2009 and No. 2010-2345 filed on Jan. 7, 2010.

FIELD OF THE INVENTION

The present invention relates to a semiconductor device including an insulated gate bipolar transistor (IGBT) and a free-wheeling diode (FWD) that are formed in the same semiconductor substrate.

For example, JP-2005-57235A and JP-2008-53648 disclose a semiconductor device including a vertical IGBT and a vertical FWD that are formed in the same semiconductor substrate. Such a semiconductor device is called a reverse conducting insulated gate bipolar transistor (RC-IGBT).

In the RC-IGBT, an anode of the FWD and an emitter of the IGBT are formed as a common electrode, and a cathode of the FWD and a collector of the IGBT are formed as a common electrode. For example, the RC-IGBT is built in an inverter circuit and used for a pulse width modulation (PWM) control of an electrical load such as a motor.

For example, JP-2004-88001A and JP-3156487 disclose a semiconductor device including an IGBT and an IGBT sensing element that are formed in the same semiconductor substrate. The IGBT sensing element is configured to pass an electric current proportional to an electric current that flows through the IGBT. The IGBT is protected from overcurrent by detecting the electric current passed through the IGBT sensing element. Thickness recovery resistance In another conventional semiconductor device, P-type base regions are repeatedly formed in an N-type semiconductor substrate along a surface of the semiconductor substrate. The base region located on an end of the base regions has a $P^+$-type base contact region, but does not has an $N^+$-type emitter region. When the base region located on the end of the base regions has the base contact region, holes that are injected into the semiconductor substrate from a $P^+$-type collector region during operation of IGBT can be efficiently drawn through the base contact region at the time of switching of IGBT. Thus, the holes are reduced so that current concentration on the base region having the emitter region can be reduced. Accordingly, a resistance of the IGBT to breakdown can be improved.

It is noted that when a RC-IGBT is used in an inverter circuit, a drive signal applied to a gate of an IGBT of an upper side of the inverter circuit is generally opposite in phase to a drive signal applied to a gate of an IGBT of a lower side of the inverter circuit. Therefore, if an inductive load is connected to the inverter circuit, there is a possibility that the drive signal may be applied to the gate of the IGBT even during freewheeling operation of a FWD. As a result, the gate of the IGBT is turned ON during the operation of the FWD so that the IGBT and the FWD can operate at the same time.

As described above, in the RC-IGBT, an anode of the FWD and an emitter of the IGBT are formed as a common electrode, and a cathode of the FWD and a collector of the IGBT are formed as a common electrode. Therefore, when the gate of the IGBT is turned ON during the operation of the FWD, the anode and the cathode of the FWD tries to be the same potential. As a result, the FWD is less likely to be in forward operation. Therefore, under a condition where the drive signal is applied to the gate of the IGBT, a forward voltage Vf of the FWD is increased. As a result, a DC loss in the semiconductor device is increased.

The present inventors have considered that the above problem can be solved by adding a FWD sensing element to a RC-IGBT in addition to a IGBT sensing element. The FWD sensing element is configured to pass an electric current proportional to an electric current flowing through a FWD of the RC-IGBT. Therefore, it can be detected whether the electric current flows thorough the FWD by using the FWD sensing element. The detection result is fed-back to a gate drive circuit. During operation of the FWD, the gate drive circuit turns OFF a gate drive signal that is applied to the IGBT. Thus, the DC loss can be reduced.

In this case, the IGBT sensing element and the FWD sensing element are formed in the same substrate as the RC-IGBT. As described above, a RC-IGBT is formed by combining an IGBT and a FWD. Therefore, the IGBT sensing element and the FWD sensing element can be combined together to form a combined sensing element.

The combined sensing element is configured to pass an electric current proportional to an electric current flowing through the IGBT and an electric current proportional to an electric current flowing through the FWD. Generally, the electric currents flowing through the combined sensing element are smaller than the electric currents flowing through the RC-IGBT. Therefore, although the combined sensing element has the same structure as the RC-IGBT, the size of the combined sensing element is smaller than the size of the RC-IGBT. For example, the size of the combined sensing element is about from one thousandth to one ten-thousandth of the size of the RC-IGBT.

As described above, the combined sensing element has the same structure as the RC-IGBT. Specifically, in the combined sensing element, part of base regions has an emitter region and a base contact region. The part of the base regions serves as not only a channel region but also an anode region of a FWD sensing element. Since a cathode region of the FWD sensing element is located directly below the base regions, the distance between the cathode region and the base regions is short. Therefore, a large number of holes are injected into the semiconductor substrate through the base contact region during operation of the FWD of the RC-IGBT. As a result, a resistance of the FWD to breakdown during recovery of the FWD is reduced (degraded).

SUMMARY OF THE INVENTION

In view of the above, it is an object of the present invention to provide a semiconductor device including a RC-IGBT and a combined sensing element for sensing electric currents flowing through the RC-IGBT, wherein a resistance of a FWD to breakdown during recovery of the FWD receiver is improved.

According to an aspect of the present invention, a semiconductor device includes a first conductivity-type semiconductor substrate having a first surface and a second surface opposite to the first surface. The semiconductor substrate has a thickness direction from the first surface to the second surface and has a planar direction perpendicular to the thickness direction. A main region is formed on the first surface side of the semiconductor substrate. The main region has a first size along the first surface of the semiconductor substrate. The main region includes a vertical insulated-gate bipolar transistor for passing a first current and a vertical free-wheeling diode for passing a second current. The free wheeling diode is connected in antiparallel with the insulated-gate bipolar transistor. A sensing region is formed on the first surface side of the semiconductor substrate. The sensing region has a second size along the first surface of the semiconductor substrate. The second size is smaller than the first size. The sensing region includes a sensing element for passing a third current proportional to the first current and for passing a fourth current proportional to the second current. The sensing region includes a second conductivity-type base region at a surface portion of the first surface side of the semiconductor substrate. The base region has a plurality of base portions arranged in a first direction parallel to the planer direction of the semiconductor substrate. A first one of the base portions includes a first conductivity-type first region at its surface portion. The first region has an impurity concentration higher than an impurity concentration of the semiconductor substrate. A second one of the base portions is located on an end of the base region in the first direction Each of the first one of the base portions and the second one of the base portions includes a second conductivity-type base contact region at its surface portion. The base contact region has an impurity concentration higher than an impurity concentration of the base region. The first region is electrically connected to the base contact region. A second conductivity-type second region is formed at a surface portion of the second surface side of the semiconductor substrate and located directly below the base region of the sensing region in the thickness direction. The third current flows between the first region and the second region. A second conductivity-type third region is formed at the surface portion of the second surface side of the semiconductor substrate and has an impurity concentration higher than the impurity concentration of the semiconductor substrate. The fourth current flows between the base contact region and the third region. The third region is separated from the base region by a predetermined distance in the planar direction of the semiconductor substrate.

According to another aspect of the present invention, a semiconductor device includes a first conductivity-type semiconductor substrate having a first surface and a second surface opposite to the first surface. A main region is formed on the first surface side of the semiconductor substrate. The main region has a first size along the first surface of the semiconductor substrate. The main region includes a vertical insulated-gate bipolar transistor for passing a first current and a vertical free-wheeling diode for passing a second current. The free wheeling diode is connected in antiparallel with the insulated-gate bipolar transistor. A sensing region is formed on the first surface side of the semiconductor substrate. The sensing region has a second size along the first surface of the semiconductor substrate. The second size is smaller than the first size. The sensing region includes a sensing element for passing a third current proportional to the first current and for passing a fourth current proportional to the second current. The sensing region includes a second conductivity-type base region at a surface portion of the first surface side of the semiconductor substrate. The base region has a plurality of base portions arranged in a first direction parallel to the planer direction of the semiconductor substrate. A first one of the base portions includes a first conductivity-type first region at its surface portion. The first region has an impurity concentration higher than an impurity concentration of the semiconductor substrate. A second one of the base portions is located on an end of the base region in the first direction. Each of the first one of the base portions and the second one of the base portions includes a second conductivity-type base contact region at its surface portion. The base contact region has an impurity concentration higher than an impurity concentration of the base region. The first region is electrically connected to the base contact region. A second conductivity-type second region is formed at a surface portion of the second surface side of the semiconductor substrate. The third current flows between the first region and the second region. A second conductivity-type third region is formed at the surface portion of the second surface side of the semiconductor substrate and has an impurity concentration higher than the impurity concentration of the semiconductor substrate. The fourth current flows between the base contact region and the third region. The second region and the third region are located adjacent to each other. The semiconductor substrate includes a lifetime killer in the sensing region. A lifetime of carriers in the semiconductor substrate is defined as $\tau$ [$\mu$s]. A diffusion coefficient of the carriers is defined as D [cm$^2$/s]. A constant value equal to or greater than one is defined as K. A shortest distance between the base contact region and the third region in the planar direction of the semiconductor substrate is defined as L1 [$\mu$m]. A distance between the base contact region and the third region in the thickness direction of the semiconductor substrate is defined as L2 [$\mu$m]. In this case, the following expression is satisfied: $K \cdot D = 40.7$ [cm$^2$/s], when $K \cdot D \cdot \tau - L2^2 \geq 0$, $L1 \geq (K \cdot D \cdot \tau - L2^2)^{1/2}$, and when $K \cdot D \cdot \tau - L2^2 < 0$, $L1 \geq 0$.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS

First Embodiment

Figure 1:
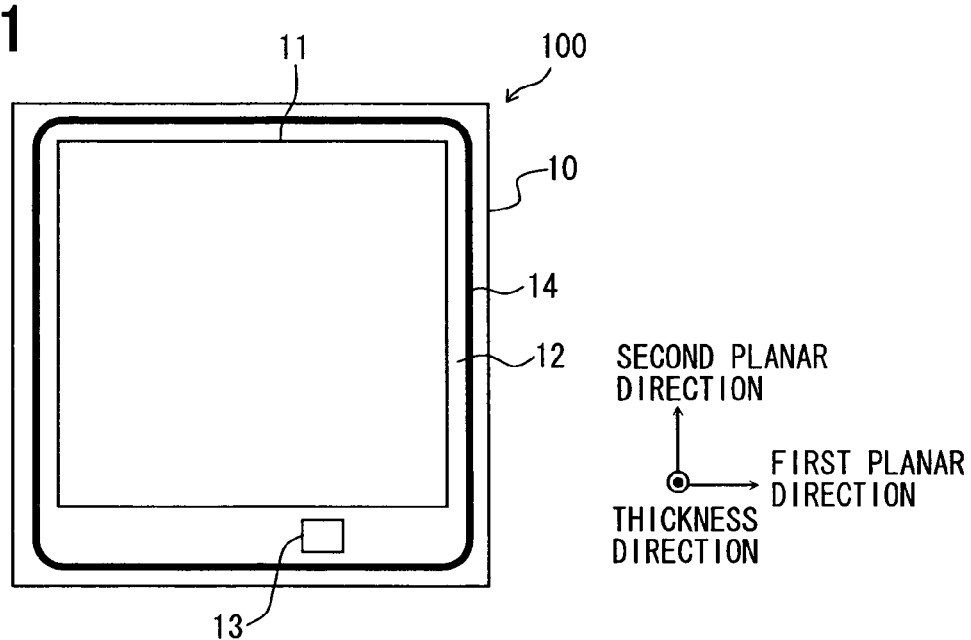
FIG. 1 is a diagram illustrating a plan view of a semiconductor device according to a first embodiment of the present invention.
Figure 2:
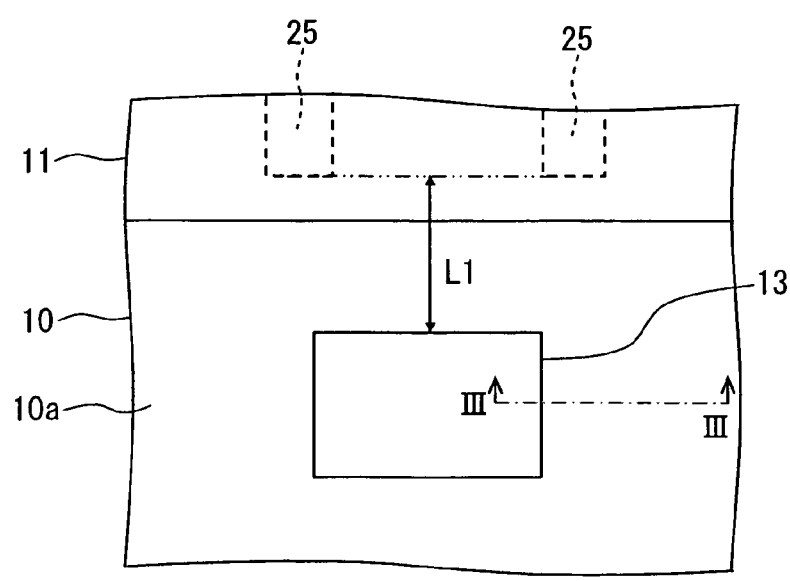
FIG. 2 is a diagram illustrating an enlarged view of a sensing region of the semiconductor device of FIG. 1.

A semiconductor device 100 according to a first embodiment of the present is described below with reference to FIGS. 1-5.

The semiconductor device 100 includes a N-type semiconductor substrate 10. The semiconductor substrate 10 has a first surface 10a and a second surface 10b opposite to the first surface 10a. The semiconductor substrate 10 includes a main region 11, and a sensing region 13. A RC-IGBT including a vertical IGBT 30 (refer to FIG. 4) and a vertical FWD 31 (refer to FIG. 4) connected in antiparallel with the IGBT 30 is mainly formed in the main region 11. A vertical sensing element 32 is mainly formed in the sensing region 13. The sensing element 32 includes an IGBT sensing portion and a FWD sensing portion. The IGBT sensing portion is configured to pass an electrical current proportional to an electric current flowing through the IGBT 30. The FWD sensing portion is configured to pass an electric current proportional to an electric current flowing through the FWD 31. In this way, the IGBT sensing portion and the FWD sensing portion are combined to form the sensing element 32. The size of the sensing region 13 is smaller than the size of the main region 11 along the first surface 10a of the semiconductor substrate 10. For example, the semiconductor device 100 can be used as a power switching device in an inverter module for an electric Hybrid Vehicle (EHV).

Figure 3:
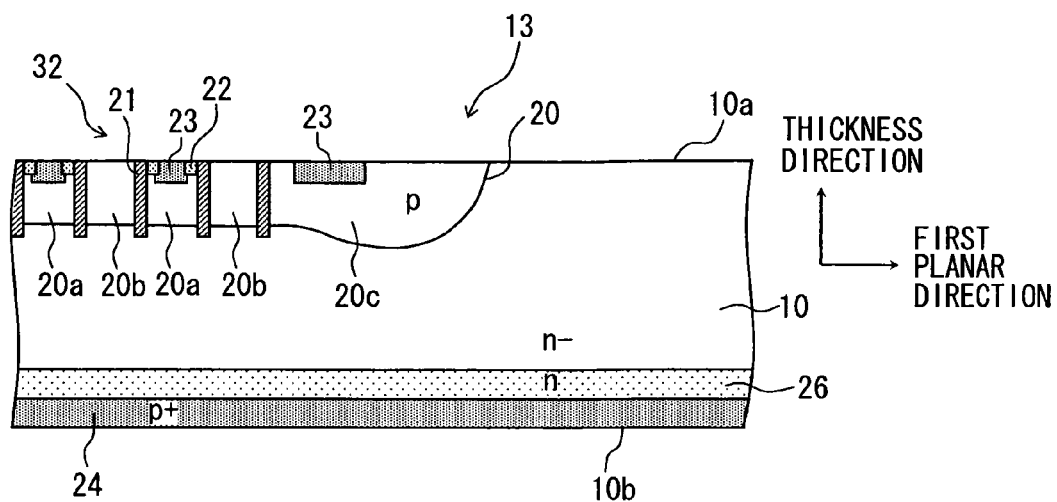
FIG. 3 is a diagram illustrating a cross-sectional view taken along the line III-III in FIG. 2.

As shown in FIG. 3, the semiconductor substrate 10 has a thickness direction from the first surface 10a to the second surface 10b. The semiconductor substrate 10 has a planar direction perpendicular to the thickness direction. As shown in FIG. 1, the planar direction includes a first planer direction and a second planer direction perpendicular to the first direction.

As shown in FIG. 1, the main region 11 is formed on the first surface side of the semiconductor substrate 10. The main region 11 is surrounded by a ring-shaped outer region 12 in the planar direction of the semiconductor substrate 10. The sensing region 13 is located in the outer region 12. The outer region 12 has a ring-shaped breakdown resistance region 14 that surrounds the main region 11 and the sensing region 13. The breakdown resistance region 14 can serve as a guard ring to ensure a resistance to breakdown.

The RC-IGBT formed in the main region 11 can have the same structure as a conventional RC-IGBT. Therefore, a detailed description of a structure of the main region 11 is left out (i.e., omitted).

The sensing region 13 is formed on the first surface side of the semiconductor substrate 10. The sensing region 13 has the same structure as the main region 11. However, as described above, the size of the sensing region 13 is smaller than the size of the main region 11 along the first surface 10a of the semiconductor substrate 10. For example, the size of the sensing region 13 can be one ten-thousandth of the size of the main region 11.

According to the first embodiment, the semiconductor substrate 10 is a N⁻-type bulk monocrystalline silicon substrate (e.g., FZ wafer) with an impurity concentration of about $1 \times 10^{14}$ cm$^{-3}$. As shown in FIG. 3, a P-type base region (i.e., P-well region) 20 is formed at a surface portion of the sensing region 13 on the first surface side of the semiconductor substrate 10.

Multiple gate electrodes 21 are formed in the base region 20. Each gate electrode 21 includes a trench. The trench extends from the first surface 10a of the semiconductor substrate 10 to a predetermined depth so the trench penetrates the base region 20. Although not shown in the drawings, an insulation layer is formed on a wall of the trench, and the trench is filled with an electrically conductive material, for example, polysilicon with an impurity concentration of about $1 \times 10^{20}$ cm$^{-3}$. The gate electrodes 21 are repeatedly formed at predetermined regular intervals in the first planar direction of the semiconductor substrate 10. Thus, the gate electrodes 21 are arranged in a strip pattern in the first planar direction. The base region 20 is divided by the gate electrodes 21 into multiple base portions 20a-20c. Thus, like the gate electrodes 21, the base portions 20a-20c are arranged in a strip pattern in the first planar direction. Each gate electrode 21 has a longitudinal direction in the second planar direction perpendicular to the first planar direction.

The base region 20 including the gate electrodes 21 has a rectangular shape along the first surface 10a of the semiconductor substrate 10. Further, a region where the base region 20 including the gate electrodes 21 is formed is almost equal to a region where the sensing region 13 is formed. Therefore, like the base region 20, the sensing region 13 has a rectangular shape along the first surface 10a of the semiconductor substrate 10.

As described above, the sensing region 13 has the same structure as the main region 11. Therefore, the main region 11 has a rectangular shape along the first surface 10a of the semiconductor substrate 10. Like the sensing region 13, the main region 11 includes a base region having base portions that are arranged in a strip pattern in the first planar direction. As shown in FIG. 1, the main region 11 is located adjacent to the sensing region 13 in the second planar direction and located parallel to the sensing region 13 in the first planar direction.

As shown in FIG. 3, the base portion 20a and the base portion 20b are alternately arranged in the first planar direction.

The base portion 20a has both an N⁺-type emitter region 22 (as a first region in claims) and a P⁺-type base contact region 23. An impurity concentration of each of the emitter region 22 and the base contact region 23 is greater than an impurity concentration of the semiconductor substrate 10.

The emitter region 22 is located on the first surface side of the semiconductor substrate 10 and located adjacent to the gate electrode 21. The emitter region 22 extends along the gate electrode 21 in the second planar direction. The base contact region 23 is located on the first surface side of the semiconductor substrate 10 and located between the emitter regions 22. The base contact region 23 extends along the gate electrode 21 in the second planar direction. For example, the emitter region 22 has a thickness of about 0.5 μm from the first surface 10a and has an impurity concentration of about $1\times10^{20}$ cm$^{-3}$, and the base contact region 23 has a thickness of about 1.0 μm from the first surface 10a and has an impurity concentration of about $3\times10^{19}$ cm$^{-3}$. The base contact region 23 of the base portion 20a serves to prevent latch-up and also serves as an anode during FWD operation of the sensing element 32.

The base portion 20b has neither the emitter region 22 nor the base contact region 23. The base portion 20b is electrically disconnected from the gate electrode 21 and an emitter pad used for sensing. Therefore, the base portion 20b is electrically floating.

For example, each of the base portions 20a, 20b has a thickness of about 4 μm from the first surface 10a and has an impurity concentration of about $2\times10^{17}$ cm$^{-3}$.

As shown in FIG. 3, the base portion 20c is located on each end of the base region 20. The base portion 20c has the base contact region 23, but does not have the emitter region 22. The base portion 20c has a thickness greater than each of the thicknesses of the base portions 20a, 20b so that the radius of curvature can be increased to reduce electric field concentration. Further, the base portion 20c has an impurity concentration greater than each of the impurity concentrations of the base portions 20a, 20b. For example, the base portion 20c has a thickness of about 9 μm from the first surface 10a and has an impurity concentration of about $1\times10^{18}$ cm$^{-3}$.

It is noted that the base portion 20c is located on each end of the base region 20 not only in the first planar direction but also in the second planar direction. Specifically, the base portion 20c has a ring shape to surround the base portions 20a, 20b. The base contact region 23 is located on each end of the base portion 20c in the first planar direction and extends along the gate electrode 21.

The base contact region 23 of the base portion 20c serves as the anode during FWD operation of the sensing element 32. Further, when turned off, the base contact region 23 of the base portion 20c serves to efficiently draw holes that are injected from a P$^+$-type collector region 24 (as a second region in claims) of the sensing element 32 into the semiconductor substrate 10 during IGBT operation of the sensing element 32. Thus, the holes in the semiconductor substrate 10 are reduced so that current concentration on the base portion 20a, in particular, on the base portion 20a located near the base portion 20c can be reduced. Accordingly, a latch up due to the current concentration is prevented so that a resistance of the IGBT sensing portion to breakdown can be improved.

The emitter region 22 and the base contact region 23 of the sensing region 13 are electrically connected to the emitter pad. Thus, the base portion 20a serves as a channel during IGBT operation of the sensing element 32. Further, the base portion 20a works in conjunction with the base contact region 23 to serve as the anode during FWD operation of the sensing element 32. The base portion 20c works in conjunction with the base contact region 23 to serve as the anode during FWD operation of the sensing element 32.

As shown in FIG. 3, the collector region 24 of the sensing element 32 is formed at a surface portion of the second surface side of the semiconductor substrate 10. The electric current proportional to the electric current flowing through the IGBT 30 of the RC-IGBT flows between the emitter region 22 and the collector region 24. It is noted that the collector region 24 is located directly below the sensing region 13 (i.e., the base region 20) in the thickness direction of the semiconductor substrate 10. That is, the collector region 24 is located facing the sensing region 13 in the thickness direction of the semiconductor substrate 10.

A N$^+$-type cathode region 25 (as a third region in claims) of the sensing element 32 is formed at the surface portion of the second surface side of the semiconductor substrate 10. The electric current proportional to the electric current flowing through the FWD 31 of the RC-IGBT flows between the base contact region 23 and the cathode region 25. It is noted that the cathode region 25 is not located directly below the sensing region 13 in the thickness direction of the semiconductor substrate 10. Specifically, the cathode region 25 is located corresponding to one of four sides of the rectangular sensing region and separated from the one side of the sensing region 13 by a predetermined distance L1 in the second planar direction.

A N-type field stop layer 26 is formed on the second surface side of the semiconductor substrate 10. Specifically, the field stop layer 26 is formed on each of the collector region 24 and the cathode region 25 to cover the entire second surface side of the semiconductor substrate 10.

According to the first embodiment, the cathode region 25 is separated from the sensing region 13 by the distance L1 in the second planar direction so that the cathode region 25 can be located directly below the main region 11 in the thickness direction of the semiconductor substrate 10. The distance L1 is a shortest distance between the sensing region 13 and the cathode region 25 in the second planer direction. For example, the distance L1 can be about 150 μm when measured from an edge of the cathode region 25 to an edge of the base contact region 23 of the sensing region 13 in the second planar direction.

As described above, the cathode region 25 of the sensing element 32 is located directly below the main region 11. That is, part of a cathode region (not shown) of the RC-IGBT is used as the cathode region 25 of the sensing element 32. More specifically, both a collector region (not shown) and the cathode region of the RC-IGBT including the cathode region 25 of the sensing element 32 are located directly below the main region 11 in the thickness direction of the semiconductor substrate 10. In contrast, only the collector region 24 of the sensing element 32 is located directly below the sensing region 13 in the thickness direction of the semiconductor substrate 10. In this way, the cathode region 25 is shared between the RC-IGBT and the sensing element 32.

The collector region 24 and the cathode region 25 of the sensing element 32 and the collector region and the cathode region of the RC-IGBT are electrically connected to a common collector electrode, which also serves as a common cathode electrode. For example, the collector region 24 has a thickness of about 0.5 μm from the second surface 10b and has an impurity concentration of about $3\times10^{19}$ cm$^{-3}$, and the cathode region 25 has a thickness of about 0.5 μm from the second surface 10b and has an impurity concentration of about $1\times10^{20}$ cm$^{-3}$. The field stop layer 26 has an impurity concentration between the impurity concentration of the semiconductor substrate 10 and the impurity concentration of the cathode region 25.

The semiconductor device 100 having the above described structure can be made by a conventional semiconductor manufacturing process. Therefore, a detailed description of a method of manufacturing the semiconductor device 100 is left out (i.e., omitted).

Figure 4:
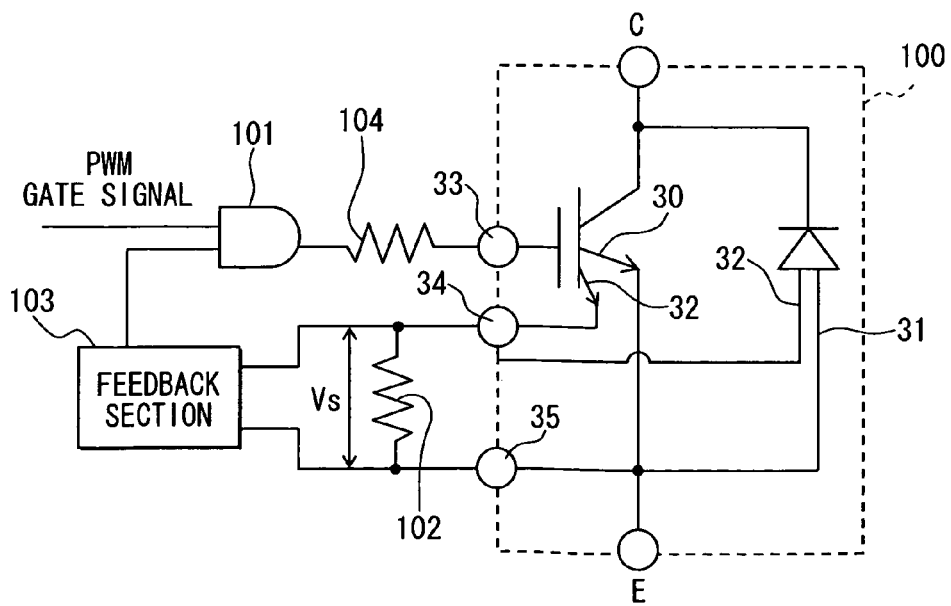
FIG. 4 is a diagram illustrating a feedback circuit employing the semiconductor device of FIG. 1.

FIG. 4 depicts a feedback circuit employing the semiconductor device 100. The feedback circuit shown in FIG. 4 corresponds to one arm of an inverter circuit for driving an electrical load such as a motor. The present inventors have filed Japanese patent applications (for example, Japanese patent application No. 2007-229959 and No. 2007-268328) for such a feedback circuit excluding the semiconductor device 100. Therefore, a detailed description of the feedback circuit is left out (i.e., omitted).

As shown in FIG. 4, the feedback circuit includes the semiconductor device 100, an AND gate 101, a sensing resistor 102, and a feedback section 103.

As described previously, the semiconductor device 100 includes the RC-IGBT that is mainly formed in the main region 11 of the semiconductor substrate 10. The RC-IGBT has the IGBT 30 and the FWD 31. The semiconductor device 100 further includes the sensing element 32 that is mainly formed in the sensing region 13 of the semiconductor substrate 10. The sensing element 32 includes the IGBT sensing portion and the FWD sensing portion.

The AND gate 101 is a logic circuit. When all inputs to the AND gate 101 are at a logic High level, an output of the AND gate 101 changes to a logic High level. A pulse-width modulation (PWM) gate signal for driving the semiconductor device 100 (i.e., the IGBT 30 and the sensing element 32) is inputted to a first input terminal of the AND gate 101. Further, an output signal of the feedback section 103 is inputted to a second input terminal of the AND gate 101. The PWM gate signal is generated by an external signal generator and supplied to the AND gate 101.

The AND gate 101 is electrically connected through a gate resistor 104 to a gate pad 33 of the semiconductor device 100. Thus, gate voltages of the IGBT 30 and the sensing element 32 can be controlled by the PWM gate signal that is supplied through the gate resistor 104 from the AND gate 101. For example, when the PWM gate signal is at a logic High level, the AND gate 101 passes the PWM gate signal so that the IGBT 30 can be turned ON, and when the PWM gate signal is at a logic Low level, the AND gate 101 blocks the PWM gate signal so that the IGBT 30 can be turned OFF. In this case, it is note that the AND gate 101 always blocks the PWM gate signal not to drive the semiconductor device 100, if the output signal of the feedback section 103 is at a Low level.

Although not shown in the drawings, a load and a power supply is connected to a collector or an emitter of the IGBT 30 so that a main current (collector current) Ic can flow between the collector and an emitter of the IGBT 30. A collector of the sensing element 32 and the collector of the IGBT 30 are formed as a common collector electrode. The emitter region 22 of the sensing element 32 is electrically connected to a first end of the sensing resistor 102 through a pad 34. A second end of the sensing resistor 102 is connected to an emitter region of the IGBT 30 through a pad 35. Thus, a sensing current Is proportional to the main current Ic flows from the emitter region 22 of the sensing element 32 to the sensing resistor 102, and a voltage Vs produced across the sensing resistor 102 by the sensing current Is is fed back to the feedback section 103.

For example, the feedback section 103 can be formed with an operational amplifier. The feedback section 103 has a first threshold value Vth1 and determines based on the first threshold value Vth1 whether an electric current flows through the FWD 31. Further, the feedback section 103 has a second threshold value Vth2 and determines based on the second threshold value Vth2 whether an overcurrent flows through the IGBT 30. According to the first embodiment, each of the first and second threshold values Vth1, Vth2 is a voltage value. The logic level (i.e., High or Low) of the output signal of the feedback section 103 depends on the determination results. Therefore, whether or not the PWM gate signal passes through the AND gate 101 depends on the determination results of the feedback section 103.

When the IGBT 30 is normally driven (i.e., when an electric current does not flow through the FWD 31), an electric current flows from the sensing element 32 to the sensing resistor 102. Thus, the voltage Vs across the sensing resistor 102 becomes a positive value with respect to a potential of the emitter region of the IGBT 30. In contrast, when an electric current flows through the FWD 31, an electric current flows from the sensing resistor 102 to the sensing element 32. Thus, the voltage Vs across the sensing resistor 102 becomes a negative value with respect to the potential of the emitter region of the IGBT 30. Therefore, an electric current flowing through the FWD 31 can be detected by setting the first threshold value Vth1 to a negative value.

When an overcurrent flows through the IGBT 30, an electric current flowing from the sensing element 32 to the sensing resistor 102 is increased. Accordingly, the voltage Vs across the sensing resistor 102 is increased within a positive value range. Therefore, an overcurrent flowing through the IGBT 30 can be detected by setting the second threshold value Vth2 to a positive value.

Figure 5:
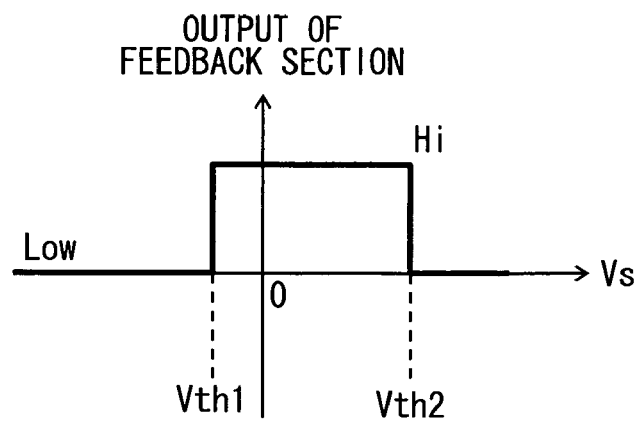
FIG. 5 is a diagram illustrating an output level of a feedback section of the feedback circuit.

The voltage Vs across the sensing resistor 102 is supplied to the feedback section 103. As shown in FIG. 5, when the voltage Vs is smaller than the first threshold value Vth1 or greater than the second threshold value Vth2, the output signal of the feedback section 103 changes to a logic Low level so as to prevent the PWM gate signal from passing through the AND gate 101. In contrast, when the voltage Vs is equal to or greater than the first threshold value Vth1 and equal to or less than the second threshold value Vth2, the output signal of the feedback section 103 changes to a logic High level so as to allow the PWM gate signal to pass through the AND gate 101.

For example, in normal times, the external signal generator generates a gate drive signal of a logic High level to drive the IGBT 30 and the sensing element 32, and the gate drive signal of a logic High level is inputted to the AND gate 101. At this time, the FWD 31 is switched OFF, and no electric current flows through the sensing element 32. Therefore, a potential of the first end (i.e., the pad 34 side) of the sensing resistor 102 becomes greater than a potential of the second end (i.e., the pad 35 side) of the sensing resistor 102 so that the voltage Vs across the sensing resistor 102 can become a positive value.

Since the voltage Vs is a positive value, the voltage Vs is greater than the first threshold value Vth1, which is a negative value. Therefore, the feedback section 103 determines that no electric current flows through the FWD 31. Consequently, as shown in FIG. 5, the output signal of the feedback section 103 changes to a logic High level, and the output signal of a logic High level is inputted to the AND gate 101. Since both the PWM gate signal and the output signal of the feedback section 103 are at a logic High level, the PWM gate signal passes through the AND gate 101. Then, the PWM gate signal passed through the AND gate 101 is applied through the gate resistor 104 to the gates of the IGBT 30 and the sensing element 32 so that the IGBT 30 and the sensing element 32 can be turned ON. In this way, the IGBT 30 and the sensing element 32 are driven so that the main current Ic can flow through the load, which is connected to the collector or the emitter of the IGBT 30.

When an electric current flows through the FWD 31, the potential of the first end (i.e., the pad 34 side) of the sensing resistor 102 becomes smaller than the potential of the second end (i.e., the pad 35 side) of the sensing resistor 102 so that the voltage Vs across the sensing resistor 102 can become a negative value.

In this case, if the voltage Vs becomes equal to or less than the first threshold value Vth1, the feedback section 103 determines that an electric current flows through the FWD 31. Consequently, as shown in FIG. 5, the output signal of the feedback section 103 changes to a logic Low level, and the output signal of a logic Low level is inputted to the AND gate 101.

Since the output signal of the feedback section 103 is at a logic Low level, the PWM gate signal cannot pass through the AND gate 101 regardless of whether the PWM gate signal is at a logic high level. As a result, the IGBT 30 is switched OFF. In this way, the IGBT 30 is not driven during forward operation of the FWD 31.

When an overcurrent flows through the IGBT 30, the sensing current flowing from the sensing element 32 to the sensing resistor 102 is increased in proportion to the overcurrent current. Accordingly, the voltage Vs across the sensing resistor 102 becomes greater than the voltage Vs that appears across the sensing resistor 102 during normal operation of the IGBT 30.

In this case, if the voltage Vs becomes equal to or greater than the second threshold value Vth2, the feedback section 103 determines that an overcurrent flows through the IGBT 30. Consequently, as shown in FIG. 5, the output signal of the feedback section 103 changes to a logic Low level, and the output signal of a logic Low level is inputted to the AND gate 101.

Since the output signal of the feedback section 103 is at a logic Low level, the PWM gate signal cannot pass through the AND gate 101 regardless of whether the PWM gate signal is at a logic high level. As a result, the IGBT 30 is switched OFF. In this way, the overcurrent flowing through the IGBT 30 is stopped so that a breakdown of the IGBT 30 can be prevented.

As described above, according to the first embodiment, the collector region 24 of the sensing element 32 is formed at the surface portion of the second surface side of the semiconductor substrate 10 and located directly below the sensing region 13 (i.e., the base region 20) in the thickness direction of the semiconductor substrate 10. The cathode region 25 of the sensing element 32 is formed at the surface portion of the second surface side of the semiconductor substrate 10 and separated from the sensing region 13 by the distance D1 in the second planar direction of the semiconductor substrate 10. That is, the cathode region 25 is not located directly below the sensing region 13 in the thickness direction of the semiconductor substrate 10.

In such an approach, a distance between the cathode region 25 and the sensing region 13 can be increased as compared to when the cathode region 25 is located directly below and the sensing region 13. The increased distance between the cathode region 25 and the sensing region 13 provides the following advantages.

During FWD operation of the sensing element 32, a portion of the semiconductor substrate 10 located between the cathode region 25 and the base contact region 23 of the base region 20 (e.g., the base portion 20c) serves as a cathode. The length of the portion serving as a cathode is increased with the increase in the distance between the cathode region 25 and the sensing region 13. Accordingly, a forward voltage Vf applied at a p-n junction between the cathode region 25 and the base contact region 23 of the base region 20 is reduced. As a result, the number of carriers (e.g., holes) injected from the base contact region 23 is reduced. Therefore, a resistance of the FWD 31 to breakdown during recovery of the FWD 31 can be improved without reducing a resistance of the IGBT sensing portion of the sensing element 32 to breakdown. The recovery resistance of the FWD 31 to breakdown during recovery of the FWD 31 is hereinafter called "the recovery resistance of the FWD".

Further, according to the first embodiment, the cathode region 25 is not located directly below the sensing region 13. In other words, only the collector region 24 is located directly below the sensing region 13. Therefore, an IGBT sensing output of the sensing element 32 can be improved (i.e., increased). The IGBT sensing output of the sensing element 32 is an output produced by the sensing element 32 when an electric current flows through the IGBT 30 of the RC-IGBT.

Further, according to the first embodiment, the cathode region 25 is located directly below the main region 11 so that the cathode region 25 can be shared between the RC-IGBT and the sensing element 32. Alternatively, the cathode region 25 can be located in a position other than a position directly below the main region 11, as long as the cathode region 25 is not located directly below the sensing region 13. For example, the cathode region 25 can be located in the outer region 12.

Second Embodiment

A second embodiment of the present invention is described below with reference to FIGS. 6-10. A difference of the second embodiment with respect to the first embodiment is as follows.

In the first embodiment, the collector region 24 of the sensing element 32 is located directly below the sensing region 13 in the thickness direction of the semiconductor substrate 10. The cathode region 25 of the sensing element 32 is not located directly below the sensing region 13 in the thickness. Specifically, the cathode region 25 is located corresponding to one side of the rectangular sensing region and separated from the one side of the sensing region 13 by the distance L1 in the second planar direction of the semiconductor substrate 10.

Figure 6:
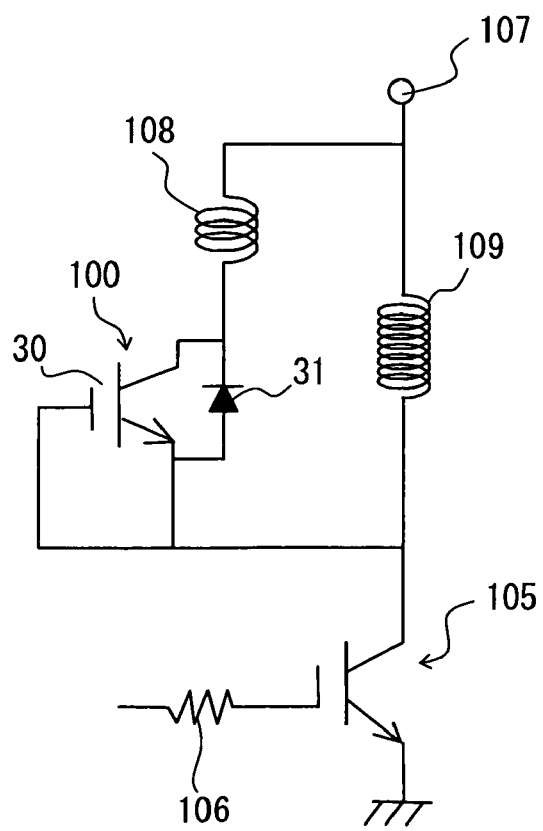
FIG. 6 is a diagram illustrating a first evaluation circuit for evaluating a recovery resistance of a FWD of a RC-IGBT to breakdown during recovery of the FWD.
Figure 7:
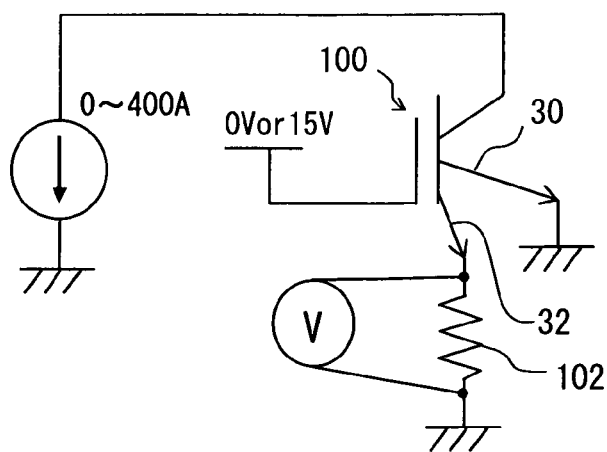
FIG. 7 is a diagram illustrating a second evaluation circuit for evaluating a FWD sensing output of a sensing element.

The present inventors have conducted experiments by using evaluation circuits shown in FIGS. 6 and 7 in order to evaluate the recovery resistance of the FWD 31 and a FWD sensing output of the sensing element 32 of the semiconductor device 100 of the first embodiment. The FWD sensing output of the sensing element 32 is an output produced by the sensing element 32 when an electric current flows through the FWD 31 of the RC-IGBT.

The evaluation circuit shown in FIG. 6 includes a switching IGBT 105 for driving the semiconductor device 100, a gate resistor 106 connected to a gate of the IGBT 105, a direct-current (DC) power source 107, a parasitic inductor 108, and a load inductor 109 connected in parallel with the semiconductor device 100.

The experiment to evaluate the recovery resistance of the FWD 31 has been conducted by using the evaluation circuit shown in FIG. 6 under the following conditions: The DC power source 107 is a 750 volts DC power source. The parasitic inductor 108 has an inductance of 200 nH. The load inductor 109 has an inductance of 100 nH. The gate and the emitter of the IGBT 30 of the semiconductor device 100 are connected together (i.e., short-circuited). A resistance of the gate resistor 106 is adjusted so that di/dt of a recovery current, which conducts at the moment of switching from ON to OFF of the FWD 31, can be 2 kA/µs. The di/dt of the recovery current represents a gradient of the current within a range of 0 A±10% with respect to an electric current flowing during turn-ON of the FWD 31.

The experiment to evaluate the FWD sensing output of the sensing element 32 has been conducted by using the evaluation circuit shown in FIG. 7 under the following conditions:

The emitter of the IGBT 30 of the semiconductor device 100 is grounded. The gate voltage of the IGBT 30 is set to 0 V or 15 V. A voltage across the sensing resistor 102 is measured by changing an electric current in a range from 0 A to 400 A.

Figure 8:
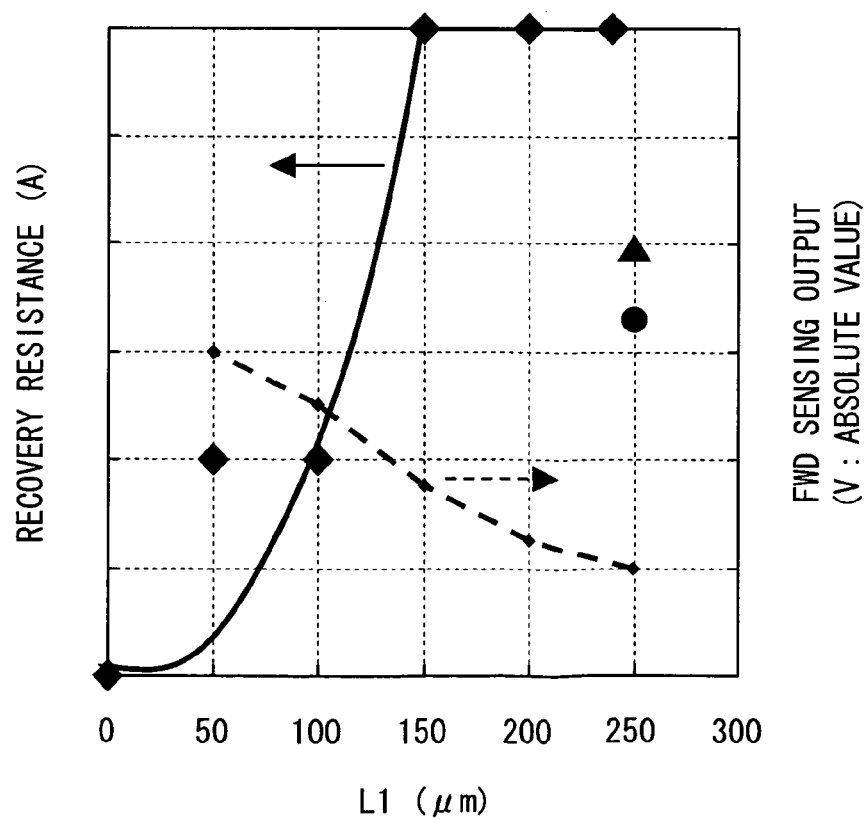
FIG. 8 is a diagram illustrating a relationship between the recovery resistance, the FWD sensing output, and a distance between the sensing region and a cathode region of a sensing element.

FIG. 8 depicts results of the experiments conducted by the present inventors. In FIG. 8, a solid line represents the recovery resistance [A] of the FWD 31, and a broken line represents the FWD sensing output [V] of the sensing element 32. It is noted that the FWD sensing output is expressed as an absolute value in FIG. 8. It can be seen From FIG. 8 that the recovery resistance of the FWD 31 increases with an increase in the shortest distance L1 between the base contact region 23 and the cathode region 25. For example, the recovery resistance of the FWD 31 is about three times greater at the distance L1 of 150 μm or more than at the distance L1 of 100 μm. Further, it can be seen From FIG. 8 that the absolute value of the FWD sensing output of the sensing element 32 decreases with the increase in the distance L1.

That is, the results of the experiments indicate that there is a trade-off relationship, between the FWD sensing output of the sensing element 32 and the recovery resistance of the FWD 31.

On the basis of the results of the experiments, according to the second embodiment, the cathode region of the sensing element 32 is located corresponding to multiple sides of the rectangular sensing region 13 in such a manner that the cathode region is separated from each corresponding side of the sensing region 13 by the distance D1. That is, the cathode region is at the same distance D1 from each corresponding side of the sensing region 13.

Figure 9:
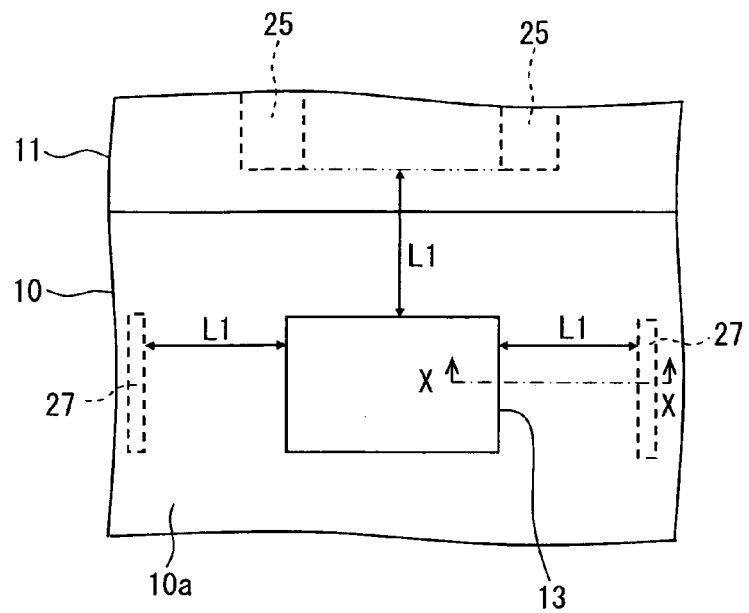
FIG. 9 is a diagram illustrating an enlarged view of a sensing region of a semiconductor device according to a second embodiment of the present invention.
Figure 10:
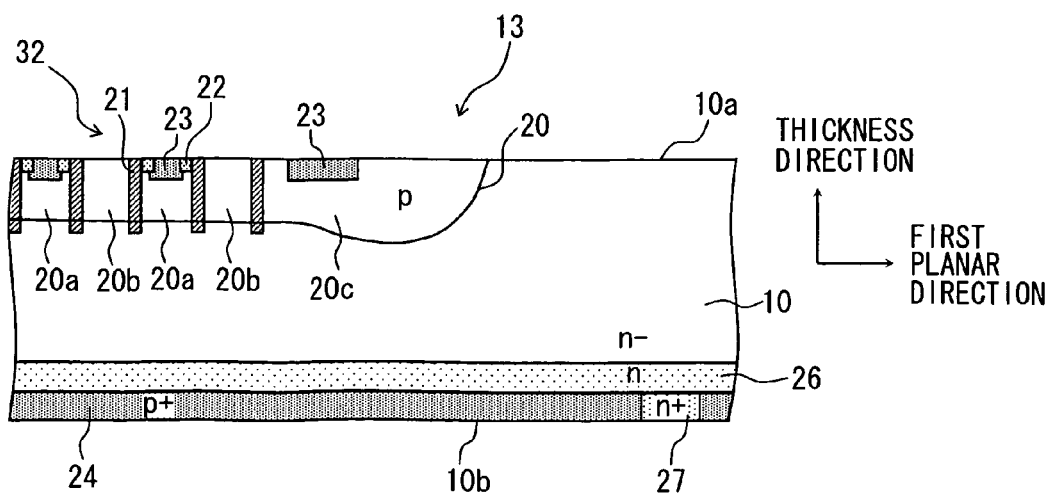
FIG. 10 is a diagram illustrating a cross-sectional view taken along the line X-X in FIG. 9.

FIG. 9 depicts a plan view of the semiconductor device 100 according to the second embodiment. FIG. 10 is a cross-sectional view taken along the line X-X in FIG. 9. In the semiconductor device 100 shown in FIGS. 9 and 10, $N^+$-type cathode regions 25, 27 (as a third region in claims) of the sensing element 32 are located corresponding to three sides of the sensing region 13.

Like the first embodiment, the cathode region 25 is located directly below the main region 11 in the thickness direction of the semiconductor substrate 10 and separated from one side (e.g., one long side) of the sensing region 13 by the distance L1 in the second planar direction of the semiconductor substrate 10. The distance L1 is measured from the edge of the cathode region 25 to the edge of the base contact region 23 of the sensing region 13 in the second planar direction of the semiconductor substrate 10. Thus, the cathode region 25 is shared between the RC-IGBT and the sensing element 32. Alternatively, the cathode region 25 can be located in a position other than a position directly below the main region 11, as long as the cathode region 25 is not located directly below the sensing region 13. For example, the cathode region 25 can be located in the outer region 12.

The cathode regions 27 are located in the outer region 12. That is, the cathode regions 27 are located directly below neither the main region nor the sensing region 13 in the thickness direction of the semiconductor substrate 10. Further, the cathode regions 27 are located opposite to each other across the sensing region 13 in the first planar direction of the semiconductor substrate 10. Each cathode regions 27 is separated from a corresponding one of two sides (e.g., two short sides) of the sensing region 13 by the distance L1 in the second planar direction of the semiconductor substrate 10. The distance L1 is measured from an edge of the cathode region 27 to an edge of the base contact region 23 of the base portion 20c in the first planar direction of the semiconductor substrate 10. In this way, each of the cathode regions 25, 27 is at the same distance D1 from the corresponding side of the sensing region 13.

As described above, according to the second embodiment, the cathode regions are located corresponding to three sides of the sensing region 13. In such an approach, the portion serving as a cathode is increased so that the FWD sensing output can be improved.

The present inventors have confirmed that the structure shown in FIGS. 9 and 10 can improve the FWD sensing output. Specifically, a solid circle in FIG. 8 represents the FWD sensing output of the structure shown in FIGS. 9 and 10, when the distance D1 is 250 μm. It can be seen from FIG. 8 that the FWD sensing output of the structure shown in FIGS. 9 and 10 is about three times greater than the FWD sensing output of the first embodiment.

It is noted that the cathode regions 25, 27 can be located corresponding to two or four (i.e., all) sides of the sensing region 13.

In an example shown in FIG. 11, the cathode region 25 is located directly below the main region 11 and located corresponding to one side of the sensing region 13. The cathode region 27 is located in the outer region 12 and located corresponding to three sides of the sensing region 13. Specifically, the cathode region 27 has a square-cornered C-shape to surround the three sides of the sensing region 13. In this way, the cathode regions 25, 27 are located corresponding to four (i.e., all) sides of the sensing region 13, and each of the cathode regions 25, 27 is at the same distance D1 from the corresponding side of the sensing region 13. Therefore, the portion serving as a cathode is more increased so that the FWD sensing output can be more improved. In the example shown in FIG. 11, the cathode region 27 is formed as a single piece having a square-cornered C-shape. Alternatively, separate three cathode regions 27 can be arranged in a square-cornered C-shape.

Figure 11:
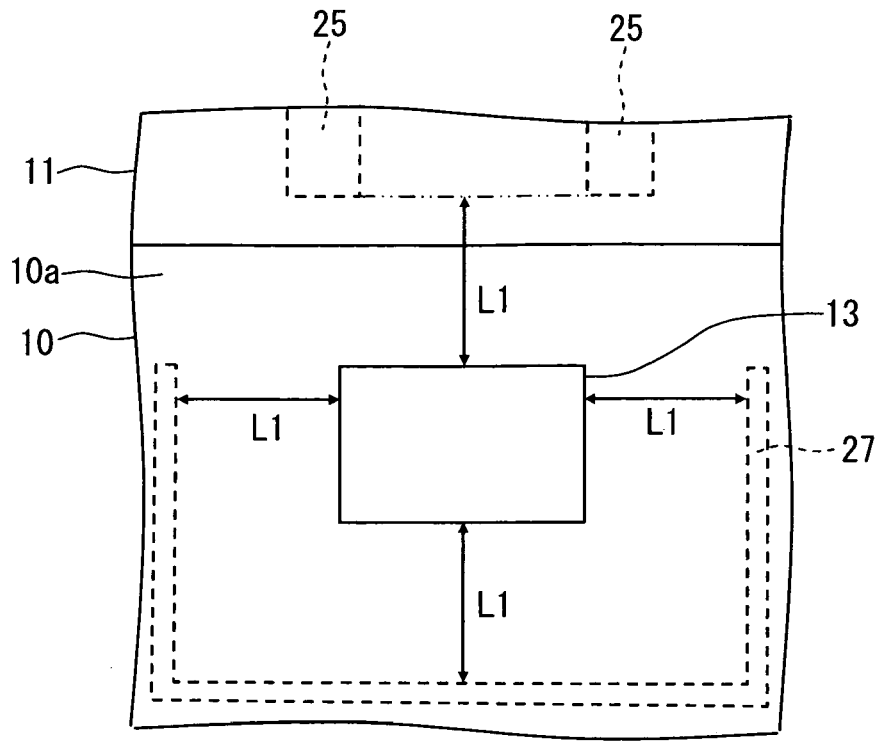
FIG. 11 is a diagram illustrating an enlarged view of a sensing region according to a modification of the second embodiment.

The present inventors have confirmed that the structure shown in FIG. 11 can improve the FWD sensing output. Specifically, a solid triangle in FIG. 8 represents the FWD sensing output of the structure shown in FIG. 11, when the distance D1 is 250 μm. It can be seen from FIG. 8 that the FWD sensing output of the structure shown in FIG. 11 is about four times greater than the FWD sensing output of the first embodiment.

In another example shown in FIG. 12, the cathode region 25 is located directly below the main region 11 and located corresponding to one side of the sensing region 13. It is noted that the cathode region 25 is at a distance greater the distance D1 from the corresponding side of the sensing region. 13. The cathode region 27 is located in the outer region 12 and located corresponding to four (i.e., all) sides of the sensing region 13. Specifically, the cathode region 27 has a rectangular ring shape to surround the four sides of the sensing region 13. In this way, the cathode regions 25, 27 are located corresponding to four (i.e., all) sides of the sensing region 13. In the example shown in FIG. 12, each side of the cathode region 27 is at the same distance D1 from the corresponding side of the sensing region 13. Therefore, the portion serving as a cathode is more increased so that the FWD sensing output can be more improved.

Figure 12:
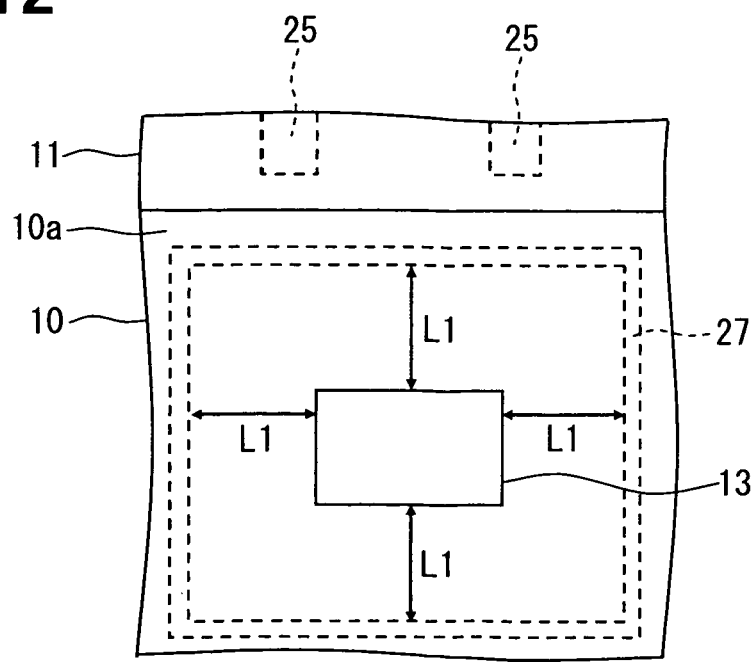
FIG. 12 is a diagram illustrating an enlarged view of a sensing region according to another modification of the second embodiment.

In the example shown in FIG. 12, the cathode region 27 is formed as a single piece having a rectangular ring shape. Alternatively, separate four cathode regions 27 can be arranged in a rectangular ring shape.

Third Embodiment

A third embodiment of the present invention is described below with reference to FIGS. 13 and 14. A difference of the third embodiment with respect to the preceding embodiments is as follows.

Figure 13:
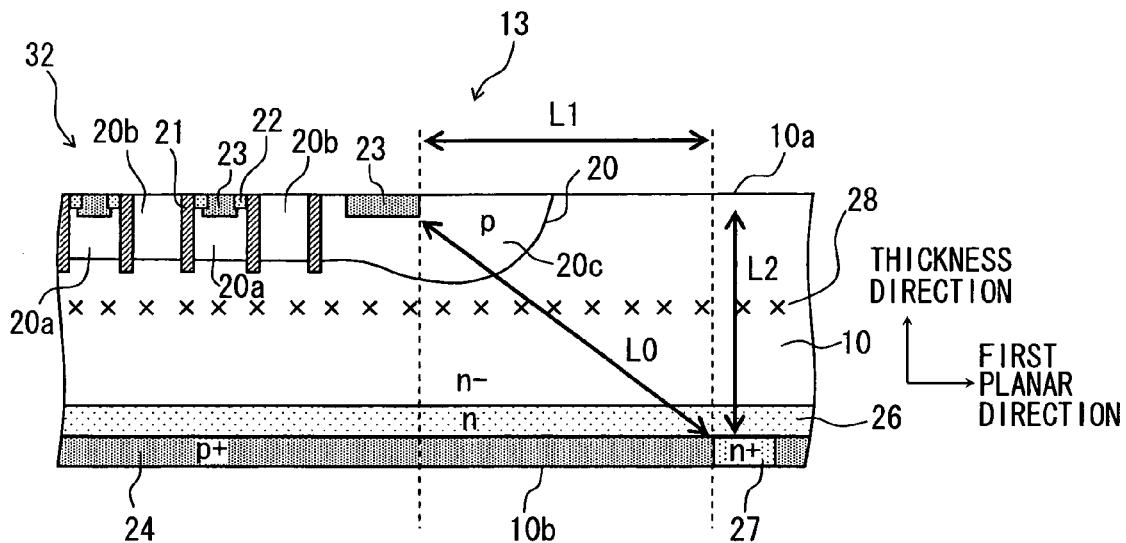
FIG. 13 is a diagram illustrating an enlarged view of a sensing region of a semiconductor device according to a third embodiment of the present invention.

FIG. 13 depicts a cross-sectional structure of the semiconductor device 100 of the third embodiment. As can be seen by comparing FIG. 10 and FIG. 13, the structure of the third embodiment is almost the same as the structure of the second embodiment. A difference between the second and third embodiments is in that a lifetime killer 28 is formed in the semiconductor substrate 10.

The lifetime killer 28 is a crystal defect intentionally formed in the semiconductor substrate 10 in order to accelerate disappearance of carriers by recombination of carriers. For example, the lifetime killer 28 can be formed in the semiconductor substrate 10 by electron irradiation, helium irradiation, proton irradiation, or gold diffusion. The lifetime killer 28 is formed at least in the sensing region 13. In such an approach, the recovery current flowing at the moment of switching from ON to OFF of the FWD 31 is reduced so that a switching loss (i.e., AC loss) can be reduced. According to the third embodiment, the lifetime killer 28 is formed in almost the entire semiconductor substrate 10, i.e., formed in not only the sensing region 13 but also in the main region 11. In FIG. 13, a lifetime killer layer as the lifetime killer 28 is located at a predetermined depth from the first surface 10a of the semiconductor substrate 10. The location of the lifetime killer 28 is not limited to FIG. 13.

As described above, according to the third embodiment, the lifetime killer 28 is formed in the semiconductor substrate 10 in order to accelerate disappearance of carriers by recombination of carriers. Therefore, a lifetime of careers in the semiconductor substrate 10 can be reduced. As a result, carriers (e.g., holes) that are injected from the base contact region 23 of the base region 20 (in particular, the base portion 20c) into the semiconductor substrate 10 can be disappeared in a short time during FWD operation of the FWD 31 and the sensing element 32. Thus, the recovery resistance of the FWD 31 can be improved.

In this way, the addition of the lifetime killer 28 to the semiconductor substrate 10 can improve the recovery resistance of the FWD 31. Therefore, even when the distance L1 between the sensing region 13 (i.e., the base contact region 23) and the cathode regions 25, 27 is reduced, the recovery resistance of the FWD 31 can be ensured.

Based on the above discussion, according to the third embodiment, the cathode regions 25, 27 are formed to satisfy the following expression:

$$K \cdot D = 40.7 \,[\text{cm}^2/\text{s}],$$

$$\text{when } K \cdot D \cdot \tau - L2^2 \geq 0, L1 \geq (K \cdot D \cdot \tau - L2^2)^{1/2} \quad (1)$$

In the expression (1), $\tau$ represents a lifetime [μs] of careers in the semiconductor substrate 10, D represents a diffusion coefficient [cm$^2$/s] of carriers, K represents a constant value equal to or greater than one, L1 represents a shortest distance [μm] between the base contact region 23 and the cathode regions 25, 27 in the planar direction, and L2 represents a shortest distance [μm] between the base contact region 23 and the cathode regions 25, 27 in the thickness direction.

It is noted that if $K \cdot D \cdot \tau - L2^2 < 0$, the cathode regions 25, 27 are formed in the same manner as in the preceding embodiments. That is, the cathode regions 25, 27 are not formed directly below the sensing region 13.

The expression (1) is discussed in detail below. As shown in FIG. 13, a straight-line distance L0 between the cathode region 27 and the base contact region 23 (in the case of FIG. 13, the base contact region 23 of the base portion 20c) that is located closest to the cathode region 27 can be expressed by using the distances L1, L2 as follows:

$$L0 = (L1^2 + L2^2)^{1/2} \quad (2)$$

A diffusion length of carriers (e.g., holes) Ld can be expressed by using the lifetime $\tau$, the constant value K, and the diffusion coefficient D as follows:

$$Ld = (K \cdot D \cdot \tau)^{1/2} \quad (3)$$

When the following expression (4) is satisfied, carriers that are injected from the base contact region 23 into the semiconductor substrate 10 through the base region 20 can be disappeared before reaching the cathode regions 25, 27. That is, when the following expression (4) is satisfied, the recovery resistance of the FWD 31 can be improved.

$$L0 \geq Ld \quad (4)$$

The expression (1) can be derived by substituting the expressions (2), (3) into the expression (4).

The present inventors have conducted an experiment by using the evaluation circuit shown in FIG. 6 in order to evaluate the recovery resistance of the semiconductor device 100 shown in FIG. 13. The experiment has been conducted by setting the distance L1 to 150 μm and the distance L2 to 135 μm. The result of the experiment has indicated that when the lifetime $\tau$ is 10 μs, the FWD 31 can have a recovery resistance enough to withstand the maximum operating limit of the semiconductor device 100.

The equation "$K \cdot D = 40.7 \,[\text{cm}^2/\text{s}]$" in the expression (1) is derived by substituting the distance L1 of 150 μm, the distance L2 of 135 μm, and the lifetime $\tau$ of 10 μs into the following expression:

$$\text{when } K \cdot D \cdot \tau - L2^2, L1 = (K \cdot D \cdot \tau - L2^2)^{1/2} \quad (5)$$

Figure 14:
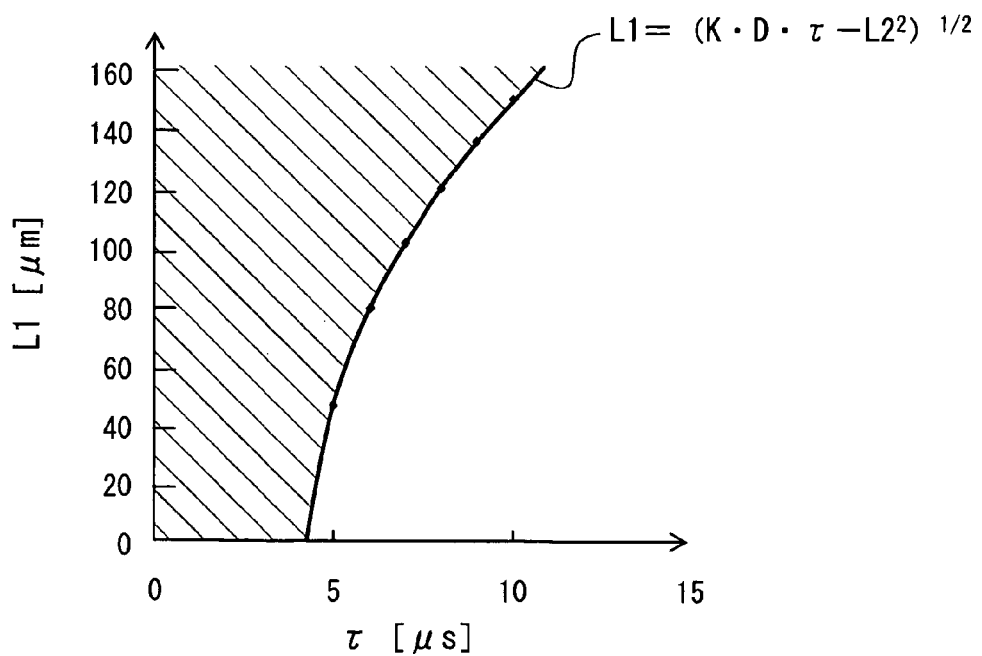
FIG. 14 is a diagram illustrating a relationship between a lifetime of carriers and the distance.

In summary, the lifetime $\tau$ and the distance D1 has a relationship shown in FIG. 14. A solid line in FIG. 14 represents the expression (5). A diagonally shaded area in FIG. 14 represents an area defined by the expression (1). That is, a value on the solid line in FIG. 14 represents a minimum value of the distance L1 that allows the FWD 31 to have the enough recovery resistance at a corresponding lifetime $\tau$.

According to the third embodiment, the cathode regions 25, 27 are formed in such a manner that the expression (1) can be satisfied. In other words, the cathode regions 25, 27 are formed in such a manner that the distance L1 can be within the diagonally shaded area in FIG. 14. In such an approach, the carriers injected from the base contact region 23 into the semiconductor substrate 10 can be disappeared before reaching the cathode regions 25, 27. Thus, the recovery resistance of the FWD 31 can be more improved.

As described above, the lifetime killer 28 accelerates disappearance of carriers so that the recovery resistance of the FWD 31 can be improved. However, in contrast to the recovery resistance, the FWD sensing output of the sensing element 32 is reduced.

The following methods may be used to improve the FWD sensing output:

(a) increasing the length of the cathode regions 25, 27 around the sensing region 13.

(b) Increasing the size of the base portion 20c to increase the amount of carriers injected into the semiconductor substrate 10.

However, the above methods (a), (b) result in an increase in the size of the sensing region 13.

According to the third embodiment, the FWD sensing output is improved by reducing the distance D1 as much as possible within a range that can satisfy the expression (1). In such an approach, the FWD sensing output can be improved without increasing the size of the sensing region 13.

It is preferable that the cathode regions 25, 27 should be formed to satisfy the expression (5). In such an approach, the FWD sensing output can be more improved while ensuring the enough recovery resistance of the FWD 31. Further, since the distance D1 has the minimum value, the size of the sensing region 13 can be reduced. The third embodiment shown in FIG. 13 is based on the structure shown in FIG. 10. Alternatively, the third embodiment shown in FIG. 13 can be based on the structure shown in any of FIG. 2, FIG. 11, and FIG. 12.

Fourth Embodiment

A fourth embodiment of the present invention is described below with reference to FIG. 15. A difference of the fourth embodiment with respect to the preceding embodiments is in that the cathode regions 25, 27 can be located directly below the sensing region 13 (i.e., base region 20) in the thickness direction of the semiconductor substrate 10.

The present inventors has studied the third embodiment in detail and found that the distance L1 can be more reduced by reducing the lifetime τ. For example, as shown in FIG. 14, the distance L1 can be zero by reducing the lifetime τ to a value equal to or smaller than 4 μs.

On the basis of the result of this study, according to the fourth embodiment, the cathode regions 25, 27 are formed to satisfy the following expression (6):

$$K\sim D=40.7 \text{ [cm}^2\text{/s]},$$

$$\text{when } K \cdot D \cdot \tau L2^2 \geq 0, L1 \geq (K \cdot D \cdot \tau - L2^2)^{1/2} \quad (6)$$

$$\text{when } K \cdot D \cdot \tau - L2^2 < 0, L1 \geq 0,$$

When the cathode regions 25, 27 are formed to satisfy the above expression (6), the carriers injected from the base contact region 23 into the semiconductor substrate 10 can be disappeared before reaching the cathode regions 25, 27, as discussed in the third embodiment. Thus, the recovery resistance of the FWD 31 can be more improved.

Further, the FWD sensing output of the sensing element 32 can be improved by reducing the distance D1 as much as possible within a range that can satisfy the expression (6). Thus, the FWD sensing output can be improved without increasing the size of the sensing region 13.

Preferably, the cathode regions 25, 27 can be formed to satisfy the following expression (7):

$$K \cdot D=40.7 \text{ [cm}^2\text{/s]},$$

$$\text{when } K \cdot D \cdot \tau - L2^2 \geq 0, L1=(K \cdot D \cdot \tau - L2^2)^{1/2} \quad (7)$$

$$\text{when } K \cdot D \cdot \tau - L2^2 < 0, L1=0,$$

According to the expression (7), when $K \cdot D \cdot \tau - L2^2 \geq 0$, the distance L1 can be reduced as much as possible. Therefore, the FWD sensing output can be improved without increasing the size of the sensing region 13.

Further, according to the expression (7), when $K \cdot D \cdot \tau - L2^2 < 0$, the distance L1 can be zero. Therefore, the FWD sensing output can be more improved while reducing the size of the sensing region 13.

It is noted that even when. $K \cdot D \cdot \tau - L2^2 \geq 0$, the distance L1 can be zero. Therefore, the cathode regions 25, 27 can be located directly below the base portion 20c of the base region 20 in the thickness direction of the semiconductor device 10.

Figure 15:
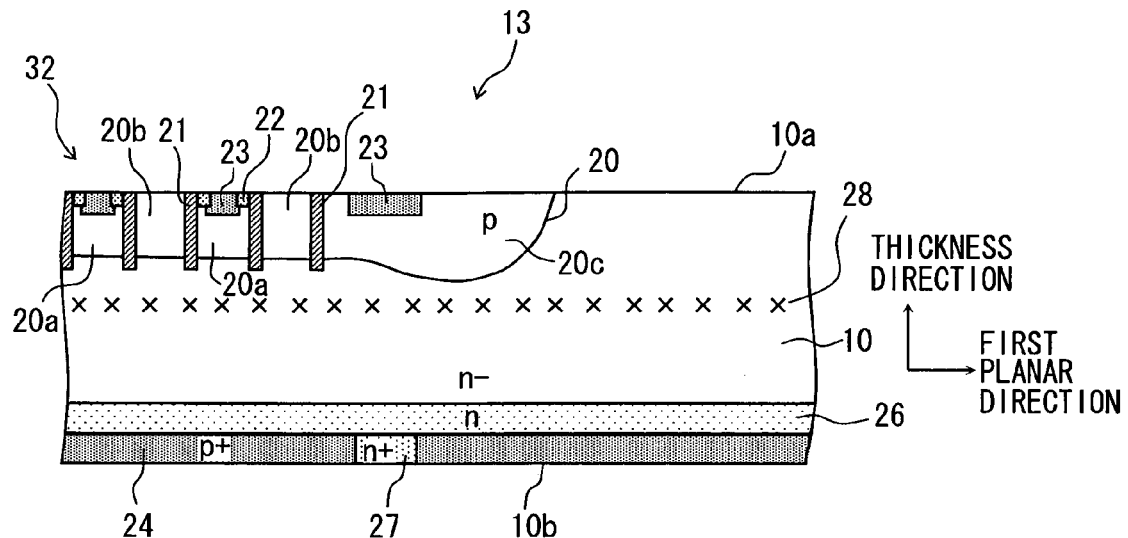
FIG. 15 is a diagram illustrating an enlarged view of a sensing region of a semiconductor device according to a fourth embodiment of the present invention.

According to the fourth embodiment, as shown in FIG. 15, the cathode region 27 is located directly below the base portion 20c that is located on each end of the base region 20 in the first planar direction of the semiconductor device 10. In such an approach, the distance L1 between the cathode region 27 and the base contact region 23 of the base portion 20c can be reduced. Therefore, the FWD sensing output can be improved while reducing the size of the sensing region 13.

More specifically, as shown in FIG. 15, the cathode region 27 is located directly below the base contact region 23 of the base portion 20c so that the distance L1 can be minimized. In such an approach, the FWD sensing output can be more improved while more reducing the size of the sensing region 13.

It is noted that even when the distance D1 is reduced below zero, i.e., even when the cathode regions 25, 27 are located inside the base contact region 23 in the first planar direction of the semiconductor substrate 10, the FWD sensing output of the sensing element 32 is almost the same as when the distance D1 is zero. Further, when the cathode regions 25, 27 are located inside the outermost gate electrode 21 in the first planar direction, the IGBT sensing output of the sensing element 32 is reduced due to a reduction of the collector region 24. Therefore, it is preferable that the cathode regions 25, 27 be located outside the outermost gate electrode 21.

In FIG. 15, the cathode region 27 is located directly below the base portion 20c that is located on each end of the base region 20 in the first planar direction of the semiconductor device 10. Alternatively, the cathode region 27 can be located directly below the base portion 20c that is located on each end of the base region 20 in the second planar direction of the semiconductor device 10.

In FIG. 15, the cathode region 27 is located directly below the base contact region 23 of the base portion 20c. Alternatively, the cathode region 27 can be located in a position other than a position directly below the base contact region 23, as long as the cathode region 27 is located directly below the base portion 20c.

Further, as long as the expressions (6)-(8) are satisfied, the cathode regions 25, 27 can be located outside the sensing region 13 in the planar direction of the semiconductor substrate 10.

Fifth Embodiment

A fifth embodiment of the present invention is described below with reference to FIGS. 16-18. A difference of the fifth embodiment with respect to the preceding embodiments is as follows.

Figure 16:
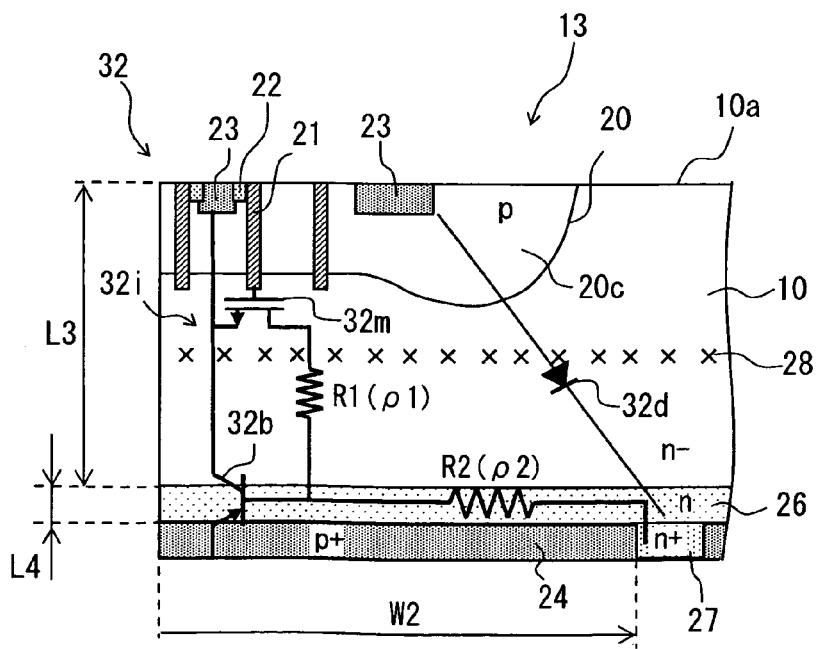
FIG. 16 is a diagram illustrating an enlarged view of a sensing region of a semiconductor device according to a fifth embodiment of the present invention.
Figure 17A:
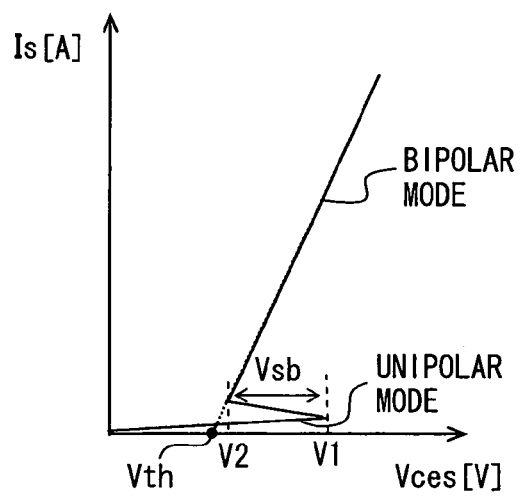
FIG. 17A is a diagram illustrating a current-voltage characteristics of an IGBT sensing element.

FIG. 16 depicts a cross-sectional structure of the semiconductor device 100 of the fifth embodiment. As can be seen by comparing FIG. 13 and FIG. 16, the structure of the fifth embodiment is almost the same as the structure of the third embodiment. A difference between the third and fifth embodiments is in that the sensing element 32 is formed to satisfy the following expression (9):

$$(\rho 1/\rho 2) \times (L3 \cdot L4/W2^2) < 1.6 \quad (9)$$

In the equation (9), ρ1 represents a resistivity [Ωm] of the semiconductor substrate 10, ρ2 represents a resistivity [Ωm] of the field stop layer 26, L3 represents a thickness [μm] of the semiconductor substrate 10 from the first surface 10a to a top surface of the field stop layer 26, L4 represents a thickness [μm] of the field stop layer 26, and W2 represents a half of a minimum width [μm] of the collector region 24 in the planar direction of the semiconductor substrate 10. The equation (9) is discussed in detail below.

As described previously, according to the embodiments of the present invention, the sensing element 32 includes the IGBT sensing portion and the FWD sensing portion. Specifically, as diagrammatically illustrated in FIG. 16, the sensing element 32 includes an IGBT sensing element 32i and a FWD sensing element 32d. In such a structure, if the minimum width of the collector region 24 is short (i.e., if the width W2 is short), it is likely that the current-voltage characteristics of the IGBT sensing element 32i shows snapback. A reason for this is described in detail in US 2008-0315248 A1, which has been filed by the present inventors.

As can be seen from FIG. 16, the width W2 changes depending on the distance L1 between the base contact region 23 and the cathode regions 25, 27. Specifically, when the distance L1 is reduced, for example, by adding the lifetime killer 28, the width W2 is reduced with a reduction in the distance L1.

A resistance R2 of the field stop layer 26 from the cathode region 27 to a channel (i.e., base region 20) that is located farthest from the cathode region 27 is reduced with a reduction in the width W2. As the resistance R2 is smaller, it is less likely that a p-n junction of a bipolar transistor portion 32b of the IGBT sensing element 32i is forward biased. As a result, a snapback voltage Vsb is increased.

The snapback means that when a collector-emitter voltage Vces [V] of the sensing element 32 (i.e., the IGBT sensing element 32i) is increased from 0V, the collector-emitter voltage Vces jumps from a unipolar mode operating point voltage V1 to a bipolar mode operating point voltage V2. As shown in FIG. 17A, a difference between the voltage V1 and the voltage V2 is the snapback voltage Vsb.

Assuming that the snapback does not occurs, the current Is rises when the collector-emitter voltage Vces reaches a voltage Vth, as shown in FIG. 17A. Then, the IGBT sensing element 32i operates in a bipolar mode. In the bipolar mode, both a MOS transistor portion 32m and the bipolar transistor portion 32b of the IGBT sensing element 32i operates so that the IGBT sensing element 32i can be turned ON.

In contrast, assuming that the snapback occurs, the current Is does not rise even when the collector-emitter voltage Vces reaches the voltage Vth. Therefore, the IGBT sensing element 32i still operates in a unipolar mode. In the unipolar mode, only the MOS transistor portion 32m of the IGBT sensing element 32i operates. In other words, in the unipolar mode, the bipolar transistor portion 32b of the IGBT sensing element 32i does not operate. Therefore, there are no holes injected from the collector region 24 into the semiconductor substrate 10. As a result, conductivity modulation of the semiconductor substrate 10 does not occur.

A resistance R1 of the semiconductor substrate 10 and the resistance R2 of the field stop layer 26 depend on their respective impurity concentration. Therefore, as shown in FIG. 17A, the current-voltage characteristics of the IGBT sensing element 32i in the unipolar mode is expressed as a starlight line graph passing through the origin. The gradient of the straight line graph is 1/(R1+R2).

In the equivalence circuit shown in FIG. 16, a voltage drop caused by the resistance R2 is equal to a base-emitter voltage Vbe of the bipolar transistor portion 32b. When the voltage drop caused by the resistance R2 exceeds a base-emitter threshold voltage Vbeth (about 0.6 V at a room temperature) of the bipolar transistor portion 32b, the bipolar transistor portion 32b starts to operate. The collector-emitter voltage Vces appearing at the time the bipolar transistor portion 32b starts to operate is the unipolar mode operating point voltage V1. When the bipolar transistor portion 32b starts to operate, holes are injected from the collector region 24 (as an emitter region of the bipolar transistor portion 32b) into the semiconductor substrate 10 through the field stop layer 26. As a result, the conductivity modulation of the semiconductor substrate 10 occurs, and the resistance R1 of the semiconductor substrate 10 is greatly reduced. In this way, the collector-emitter voltage Vces is reduced from the unipolar mode operating point voltage V1 to the bipolar mode operating point voltage V2. That is, the snapback occurs.

It is noted that the threshold voltage Vth of the IGBT sensing element 32i is equal to the threshold voltage Vbeth of the bipolar transistor portion 32b. The threshold voltage Vth, i.e., the threshold voltage Vbeth is in a range from about 0.4 V to about 0.8 V under a normal usage environment in which a temperature is in a range from about minus 40° C. to about plus 150° C. The threshold voltage Vbeth becomes higher, as a temperature becomes lower. For example, the threshold voltage Vbeth is about 0.8 volts at a temperature of minus 40° C.

Figure 17B:
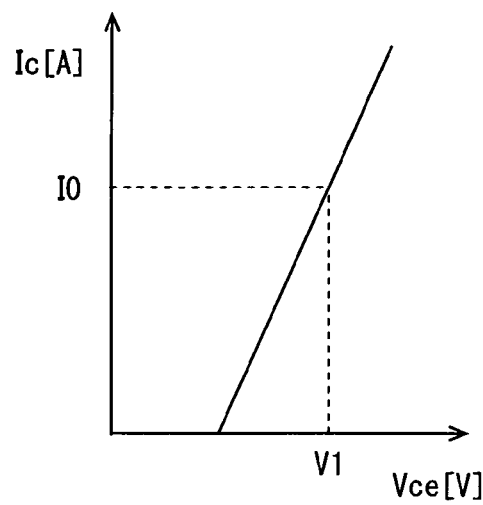
FIG. 17B is a diagram illustrating a current-voltage characteristics of an IGBT.
Figure 18:
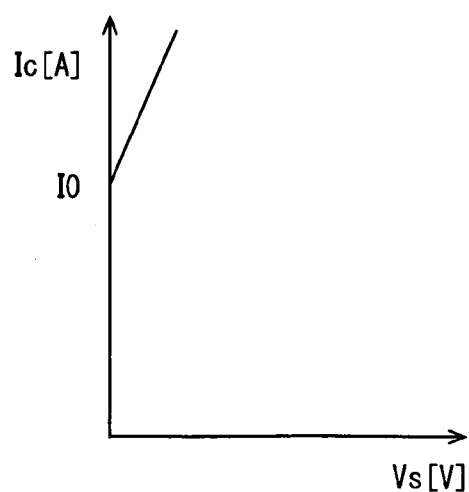
FIG. 18 is a diagram illustrating a relationship between a sensing output and an electric current flowing through the IGBT.

Here, assuming that the main region 11 is structured, in the same manner as disclosed in US 2008-0315248 A1, it is possible to prevent a current-voltage (Ic-Vce) characteristics of the IGBT 30 of the RC-IGBT from showing snapback, as shown in FIG. 17B. In this case, as shown in FIG. 18, the output of the IGBT sensing element 32i, i.e., the voltage Vs across the sensing resistor 102 (refer to FIG. 4) does not rise, until the collector current Ic exceeds a value I0. The value I0 is a value of the collector current Ic when the collector-emitter voltage Vice reaches the unipolar mode operating point voltage V1.

In summary, when the main region 11 is structured in the same manner as disclosed in US 2008-0315248 A1, the snapshot does not occur in the IGBT 30 of the RC-IGBT. However, as described above, the snapshot may occur in the sensing element 32 (i.e., the IGBT sensing element 32i). In this case, the output of the IGBT sensing element 32i does not rise until the collector current Ic exceeds the value M. Therefore, it is impossible to perform the feedback control, which is discussed in the first embodiment. As a result, the output of the IGBT sensing element 32i is greatly reduced.

As described above, as the width W2 of the collector region 24 is short, it is likely that the snapback occurs in the IGBT sensing element 32i. Therefore, according to the fifth embodiment, the cathode regions 25, 27 are formed to satisfy the expression (9) so that the width W2 can be taken into consideration. When the expression (9) is satisfied, the snapshot voltage Vsb in the IGBT sensing element 32i can be reduced below 0.8 V, which is the threshold voltage Vth at a temperature of minus 40° C. A reason for this is disclosed in detail in US 2008-0315248 A1.

As described above, according to the fifth embodiment, according to the fifth embodiment, the cathode regions 25, 27 are formed by taking into consideration the width W2 in addition to the distance D1. In such an approach, the snapback in the IGBT sensing element 32i is reduced so that the output of the FWD sensing element 32d can be improved.

It is noted that as a right-hand value of the expression (9) becomes smaller, each of the width W2 and the distance L1 becomes larger. As a result, the resistance R2 becomes larger. For example, assuming that the right-hand value of the expression (9) is 0.4, the snapback voltage Vsb is reduced below 0.1 V. Therefore, the snapback voltage Vsb can be negligible compared with 0.8 V, which is the threshold voltage Vth at a temperature of minus 40° C. A reason for this is disclosed in detail in US 2008-0315248 A1.

In the structure shown in FIG. 16, the lifetime killer 28 is formed in the semiconductor substrate 10. Alternatively, the lifetime killer 28 can be removed as needed.

Modifications

The embodiment described above can be modified in various ways, for example, as follows.

In the embodiments, n-type corresponds to a first conductivity type in claims, and p-type corresponds to a second conductivity type in claims. Alternatively, n-type can correspond to a second conductivity type in claims, and p-type can correspond to a first conductivity type in claims.

In the embodiments, the sensing region 13 has a rectangular shape in the planar direction of the semiconductor substrate 10. Alternatively, the sensing region 13 can have a shape other than a rectangle. Even when the sensing region 13 has a shape other than a rectangle, the FWD sensing output can be improved by locating the cathode regions in such a manner that each cathode region can be at the same distance L1 from a corresponding side of the sensing region 13. In this case, it is preferable that all sides of the sensing region 13 should be surrounded by the cathode regions so as to improve the FWD sensing output as much as possible.

A p-type well region can be formed in the outer region 12 around the sensing region 13 to increase a resistance to breakdown. The base region of the RC-IGBT can be elongated to the outer region 12. The field stop layer 26 can be removed as needed.

In the embodiments, the base region 20 is divided by the trench gate electrodes 21 into multiple base portions 20a-20c that are arranged in the first planar direction of the semiconductor substrate 10. Alternatively, planer gate electrodes can be used instead of the trench gate electrodes.

In the embodiments, the sensing resistor 102 is connected to the emitter side and the anode side of the sensing element 32. Alternatively, the sensing resistor 102 can be connected to the collector side and the cathode side of the sensing element 32.

Figure 19:
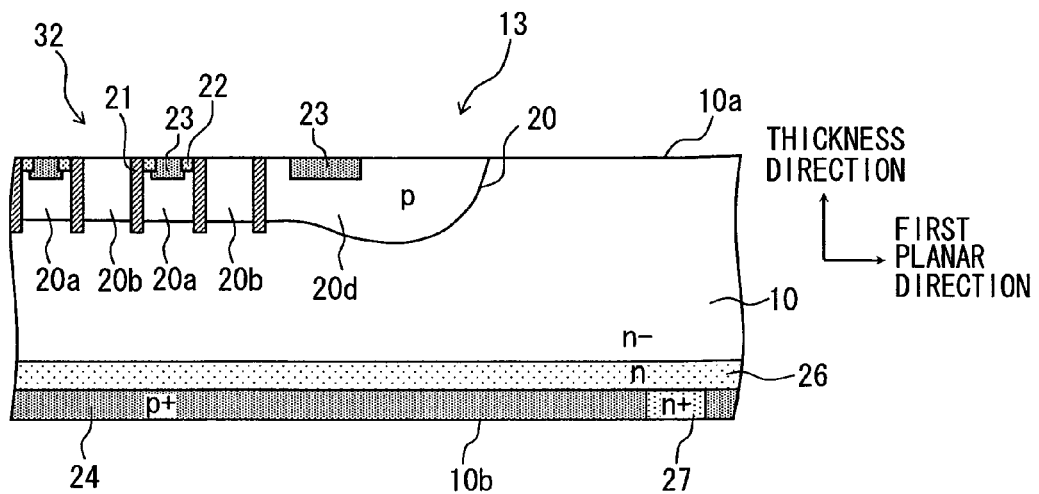
FIG. 19 is a diagram illustrating a cross-sectional view of a semiconductor device according to a modification of the present invention.

In the embodiments, the impurity concentration of the base portion 20c is greater than each of the impurity concentrations of the base portion 20a and the base portion 20b. Alternatively, as shown in FIG. 19, the impurity concentration of the base portion 20c can be less than each of the impurity concentrations of the base portions 20a, 20b without changing the shape of the base portion 20c. Even in such an case, holes that are injected from the base region 20c into the semiconductor substrate 10 during FWD operation are reduced so that the recovery resistance can be improved.

Figure 20:
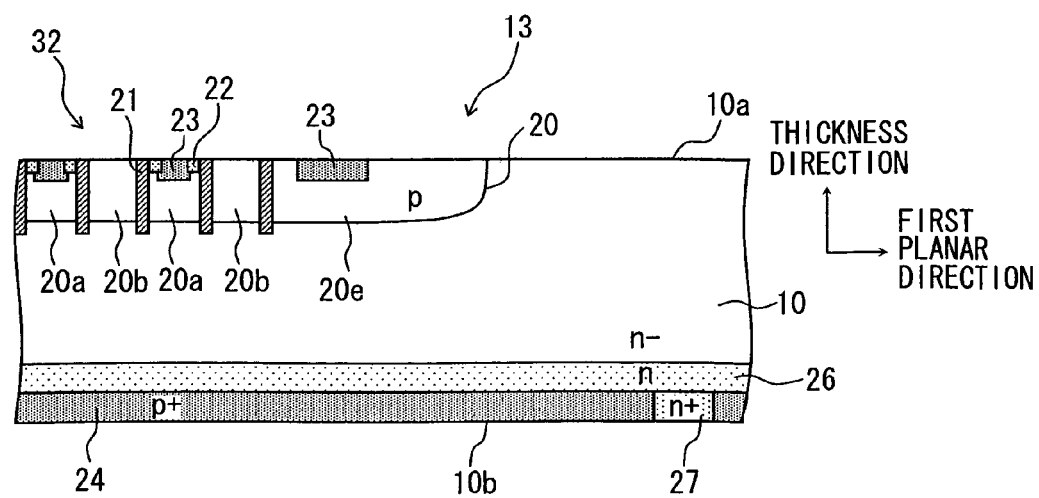
FIG. 20 is a diagram illustrating a cross-sectional view of a semiconductor device according to another modification of the present invention.

In the embodiments, the thickness of the base portion 20c from the first surface 10a of the semiconductor substrate 10 is greater than each of the thicknesses of the base portions 20a, 20b. Alternatively, as shown in FIG. 20, the thickness of the base portion 20c can be less than each of the thicknesses of the base portions 20a, 20b. Even in such a case, holes that are injected from the base region 20c into the semiconductor substrate 10 during FWD operation are reduced so that the recovery resistance can be improved.

Such changes and modifications are to be understood as being within the scope of the present invention as defined by the appended claims.

What is claimed is:

1. A semiconductor device comprising:
a first conductivity-type semiconductor substrate having a first surface and a second surface opposite to the first surface, the semiconductor substrate having a thickness direction from the first surface to the second surface and a planar direction perpendicular to the thickness direction;
a main region located on the first surface side of the semiconductor substrate and having a first size along the first surface of the semiconductor substrate, the main region including a vertical insulated-gate bipolar transistor for passing a first current and a vertical free-wheeling diode for passing a second current, the free wheeling diode being connected in antiparallel with the insulated-gate bipolar transistor; and
a sensing region located on the first surface side of the semiconductor substrate and having a second size along the first surface of the semiconductor substrate, the second size being smaller than the first size, the sensing region including a sensing element for passing a third current proportional to the first current and for passing a fourth current proportional to the second current, wherein
the sensing region includes a second conductivity-type base region at a surface portion of the first surface side of the semiconductor substrate, the base region having a plurality of base portions arranged in a first direction parallel to the planer direction of the semiconductor substrate,
a first one of the plurality of base portions includes a first conductivity-type first region at its surface portion, the first region having an impurity concentration higher than an impurity concentration of the semiconductor substrate,
a second one of the plurality of base portions is located on an end of the base region in the first direction,
each of the first one of the plurality of base portions and the second one of the plurality of base portions includes a second conductivity-type base contact region at its surface portion, the base contact region having an impurity concentration higher than an impurity concentration of the base region,
the first region is electrically connected to the base contact region,
a second conductivity-type second region is formed at a surface portion of the second surface side of the semiconductor substrate and located directly below the base region of the sensing region in the thickness direction,
the third current flows between the first region and the second region,
a second conductivity-type third region is formed at the surface portion of the second surface side of the semiconductor substrate and has an impurity concentration higher than the impurity concentration of the semiconductor substrate,
the fourth current flows between the base contact region and the third region, and
the third region is separated from the base region by a predetermined distance in the planar direction of the semiconductor substrate.

2. The semiconductor device according to claim 1, wherein
the base region has a rectangular shape in the planar direction,
the third region is located corresponding to at least two sides of the base region in the planar direction and at the same distance from the at least two sides of the base region.

3. The semiconductor device according to claim 2, wherein
the third region is located corresponding to four sides of the base region in the planar direction and at the same distance from the four sides of the base region.

4. The semiconductor device according to claim 3, wherein
the third region is not located directly below the main region, and
the third region has a ring shape to surround the four sides of the base region in the planar direction.

5. The semiconductor device according to claim 3, wherein
the third region includes a first portion and a second portion,
the first portion of the third region is located directly below the main region in the thickness direction of the semiconductor substrate, and
the second portion of the third region is not located directly below the main region in the thickness direction of the semiconductor substrate and has a square-cornered C-shape to surround three sides of the base region in the planar direction of the semiconductor substrate.

6. The semiconductor device according to claim 1, wherein
the third region surrounds an outer edge of the base region in the planar direction and is at the same distance from the outer edge of the base region in the planar direction.

7. The semiconductor device according to claim 6, wherein
the third region is not located directly below the main region in the thickness direction of the semiconductor substrate and has a ring-shape to surround the outer edge of the base region in the planar direction of the semiconductor substrate.

8. The semiconductor device according to claim 6, wherein
a portion of the third region is located directly below the main region in the thickness direction of the semiconductor substrate.

9. The semiconductor device according to claim 1, wherein
the semiconductor substrate includes a lifetime killer in the sensing region.

10. The semiconductor device according to claim 9, wherein
a lifetime of carriers in the semiconductor substrate is defined as $\tau$ [µs],
a diffusion coefficient of the carriers is defined as D [cm$^2$/s],
a constant value equal to or greater than one is defined as K,
a shortest distance between the base contact region and the third region in the planar direction of the semiconductor substrate is defined as L1 [µm],
a distance between the base contact region and the third region in the thickness direction of the semiconductor substrate is defined as L2 [µm], $$K \cdot D = 40.7 \ [\text{cm}^2/\text{s}],$$

$$K \cdot D \cdot \tau - L2^2 \geq 0, \text{ and}$$

$$L1 \geq (K \cdot D \cdot \tau - L2^2)^{1/2}.$$

11. The semiconductor device according to claim 10, wherein $$L1 = (K \cdot D \cdot \tau - L2^2)^{1/2}.$$

12. The semiconductor device according to claim 1, further comprising:
a field stop layer formed on the second surface side of the semiconductor substrate and having an impurity concentration between the impurity concentration of the semiconductor substrate and the impurity concentration of the third region, the field stop layer having top and bottom surfaces opposite to each other in the thickness direction of the semiconductor substrate, the bottom surface being located on each of the second region and the third region, wherein a resistivity of the semiconductor substrate is defined as $\rho1$ [Ωcm],
a resistivity of the field stop layer is defined as $\rho2$ [Ωcm],
a thickness of the semiconductor substrate from the first surface to the top surface of the field stop layer is defined as L3 [µm],
a thickness of the field stop layer from the top surface to the bottom surface is defined as L4 [µm],
a half of a minimum width of the second region is defined as W2 [µm], and $$(\rho1/\rho2) \times (L3 \cdot L4/W2^2) < 1.6.$$

13. A semiconductor device comprising:
a first conductivity-type semiconductor substrate having a first surface and a second surface opposite to the first surface, the semiconductor substrate having a thickness direction from the first surface to the second surface and a planar direction perpendicular to the thickness direction;
a main region located on the first surface side of the semiconductor substrate and having a first size along the first surface of the semiconductor substrate, the main region including a vertical insulated-gate bipolar transistor for passing a first current and a vertical free-wheeling diode for passing a second current, the free wheeling diode being connected in antiparallel with the insulated-gate bipolar transistor; and
a sensing region located on the first surface side of the semiconductor substrate and having a second size along the first surface of the semiconductor substrate, the second size being smaller than the first size, the sensing region including a sensing element for passing a third current proportional to the first current and for passing a fourth current proportional to the second current, wherein
the sensing region includes a second conductivity-type base region at a surface portion of the first surface side of the semiconductor substrate, the base region having a plurality of base portions arranged in a first direction parallel to the planer direction of the semiconductor substrate,
a first one of the plurality of base portions includes a first conductivity-type first region at its surface portion, the first region having an impurity concentration higher than an impurity concentration of the semiconductor substrate,
a second one of the plurality of base portions is located on an end of the base region in the first direction,
each of the first one of the plurality of base portions and the second one of the plurality of base portions includes a second conductivity-type base contact region at its surface portion, the base contact region having an impurity concentration higher than an impurity concentration of the base region,
the first region is electrically connected to the base contact region,
a second conductivity-type second region is formed at a surface portion of the second surface side of the semiconductor substrate,
the third current flows between the first region and the second region,
a second conductivity-type third region is formed at the surface portion of the second surface side of the semiconductor substrate and has an impurity concentration higher than the impurity concentration of the semiconductor substrate, the fourth current flows between the base contact region and the third region, the second region and the third region are located adjacent to each other, the semiconductor substrate includes a lifetime killer in the sensing region, a lifetime of carriers in the semiconductor substrate is defined as $\tau$ [μs]

a diffusion coefficient of the carriers is defined as D [cm$^2$/s], a constant value equal to or greater than one is defined as K, a shortest distance between the base contact region and the third region in the planar direction of the semiconductor substrate is defined as L1 [μm]

a distance between the base contact region and the third region in the thickness direction of the semiconductor substrate is defined as L2 [μm], $K \cdot D = 40.7$ [cm$^2$/s], when $K \cdot D \cdot \tau - L2^2 \geq 0$, $L1 \geq (K \cdot D \cdot \tau - L2^2)^{1/2}$, and when $K \cdot D \cdot \tau - L2^2 < 0$, $L1 \geq 0$.

14. The semiconductor device according to claim 13, wherein $K \cdot D \cdot \tau - L2^2 \geq 0$, and $L1 = (K \cdot D \cdot \tau - L2^2)^{1/2}$.

15. The semiconductor device according to claim 13, wherein $K \cdot D \cdot \tau - L2^2 < 0$, and $L1 = 0$.

16. The semiconductor device according to claim 13, further comprising:

a plurality of gate electrodes formed in the sensing region on the first surface side of the semiconductor substrate, wherein the third region is located outside the outermost gate electrode of the plurality of gate electrodes in the planar direction of the semiconductor substrate and located directly below the base region in the thickness direction of the semiconductor substrate.

17. The semiconductor device according to claim 16, wherein each of the plurality of gate electrodes has a trench extending from the first surface of the semiconductor substrate to a predetermined depth, and the trench being filled with an electrically conductive material, and the plurality of gate electrodes divides the base region into the plurality of base portions.

18. The semiconductor device according to claim 16, wherein the third region is located directly below the base contact region of the second one of the plurality of base portions.

19. The semiconductor device according to claim 13, further comprising:

a field stop layer formed on the second surface side of the semiconductor substrate and having an impurity concentration between the impurity concentration of the semiconductor substrate and the impurity concentration of the third region, the field stop layer having top and bottom surfaces opposite to each other in the thickness direction of the semiconductor substrate, the bottom surface being located on each of the second region and the third region, wherein a resistivity of the semiconductor substrate is defined as $\rho 1$ [Ωcm], a resistivity of the field stop layer is defined as $\rho 2$ [Ωcm], a thickness of the semiconductor substrate from the first surface to the top surface of the field stop layer is defined as L3 [μm], a thickness of the field stop layer from the top surface to the bottom surface is defined as L4 [μm], a half of a minimum width of the second region is defined as W2 [μm], and $(\rho 1/\rho 2) \times (L3 \cdot L4/W2^2) < 1.6$.

* * * * *